(12) United States Patent
Yu et al.

(10) Patent No.: US 11,664,349 B2
(45) Date of Patent: *May 30, 2023

(54) STACKED CHIP PACKAGE AND METHODS OF MANUFACTURE THEREOF

(71) Applicant: Taiwan Semiconductor Manufacturing Co., Ltd., Hsinchu (TW)

(72) Inventors: Chen-Hua Yu, Hsinchu (TW); Ming-Fa Chen, Taichung (TW); Sung-Feng Yeh, Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 88 days.

This patent is subject to a terminal disclaimer.

(21) Appl. No.: 17/099,395

(22) Filed: Nov. 16, 2020

(65) Prior Publication Data
US 2021/0074684 A1 Mar. 11, 2021

Related U.S. Application Data

(63) Continuation of application No. 16/225,665, filed on Dec. 19, 2018, now Pat. No. 10,840,217, which is a
(Continued)

(51) Int. Cl.
*H01L 25/065* (2023.01)
*H01L 23/14* (2006.01)
(Continued)

(52) U.S. Cl.
CPC .... *H01L 25/0657* (2013.01); *H01L 21/76898* (2013.01); *H01L 23/147* (2013.01);
(Continued)

(58) Field of Classification Search
CPC .......... H01L 25/0657; H01L 21/76898; H01L 23/147; H01L 23/3114; H01L 23/481;
(Continued)

(56) References Cited

U.S. PATENT DOCUMENTS 8,604,615 B2  12/2013  Lee et al.
9,153,520 B2  10/2015  Groothuis et al.
(Continued)

FOREIGN PATENT DOCUMENTS

CN  101950745 A  1/2011
CN  102163561 A  8/2011
(Continued)

*Primary Examiner* — Duy T Nguyen
(74) *Attorney, Agent, or Firm* — Slater Matsil, LLP

(57) ABSTRACT

A chip package is provided. The chip package includes a semiconductor chip and a semiconductor die over the semiconductor chip. The chip package also includes a dielectric layer over the semiconductor chip and encapsulating the semiconductor die, and the dielectric layer is substantially made of a semiconductor oxide material. The chip package further includes a conductive feature penetrating through a semiconductor substrate of the semiconductor die and physically connecting a conductive pad of the semiconductor chip.

20 Claims, 35 Drawing Sheets

Related U.S. Application Data continuation of application No. 14/919,378, filed on Oct. 21, 2015, now Pat. No. 10,163,859.

(51) Int. Cl.

| | | |
|---|---|---|
| *H01L 23/31* | (2006.01) | |
| *H01L 23/48* | (2006.01) | |
| *H01L 23/498* | (2006.01) | |
| *H01L 23/538* | (2006.01) | |
| *H01L 23/00* | (2006.01) | |
| *H01L 21/768* | (2006.01) | |
| *H01L 21/56* | (2006.01) | |
| *H01L 21/66* | (2006.01) | |

(52) U.S. Cl.
CPC ........ *H01L 23/3114* (2013.01); *H01L 23/481* (2013.01); *H01L 23/49811* (2013.01); *H01L 23/5389* (2013.01); *H01L 24/09* (2013.01); *H01L 24/19* (2013.01); *H01L 24/20* (2013.01); *H01L 24/24* (2013.01); *H01L 24/25* (2013.01); *H01L 24/80* (2013.01); *H01L 24/82* (2013.01); *H01L 24/94* (2013.01); *H01L 24/96* (2013.01); *H01L 21/568* (2013.01); *H01L 22/32* (2013.01); *H01L 23/3135* (2013.01); *H01L 24/08* (2013.01); *H01L 2224/04105* (2013.01); *H01L 2224/05571* (2013.01); *H01L 2224/06517* (2013.01); *H01L 2224/08145* (2013.01); *H01L 2224/08146* (2013.01); *H01L 2224/08225* (2013.01); *H01L 2224/09517* (2013.01); *H01L 2224/12105* (2013.01); *H01L 2224/16227* (2013.01); *H01L 2224/24105* (2013.01); *H01L 2224/24226* (2013.01); *H01L 2224/25* (2013.01); *H01L 2224/2518* (2013.01); *H01L 2224/73267* (2013.01); *H01L 2224/80895* (2013.01); *H01L 2224/80896* (2013.01); *H01L 2224/80948* (2013.01); *H01L 2224/80986* (2013.01); *H01L 2224/821* (2013.01); *H01L 2224/82031* (2013.01); *H01L 2224/9222* (2013.01); *H01L 2224/92244* (2013.01); *H01L 2224/94* (2013.01); *H01L 2225/06524* (2013.01); *H01L 2225/06541* (2013.01); *H01L 2225/06548* (2013.01); *H01L 2924/15311* (2013.01); *H01L 2924/3511* (2013.01)

(58) Field of Classification Search
CPC .......... H01L 23/49811; H01L 23/5389; H01L 24/09; H01L 24/19; H01L 24/20; H01L 24/24; H01L 24/25; H01L 24/80; H01L 24/82; H01L 24/94; H01L 24/96; H01L 21/568; H01L 22/32; H01L 23/3135; H01L 24/08; H01L 2224/04105; H01L 2224/05571; H01L 2224/06517; H01L 2224/08145; H01L 2224/08146; H01L 2224/08225; H01L 2224/09517; H01L 2224/12105; H01L 2224/16227; H01L 2224/24105; H01L 2224/24226; H01L 2224/25; H01L 2224/2518; H01L 2224/73267; H01L 2224/80895; H01L 2224/80896; H01L 2224/80948; H01L 2224/80986; H01L 2224/821; H01L 2224/82031; H01L 2224/9222; H01L 2224/92244; H01L 2224/94; H01L 2225/06524; H01L 2225/06541; H01L 2225/06548; H01L 2924/15311; H01L 2924/3511; H01L 2224/08058; H01L 21/56; H01L 23/291
USPC .......................................................... 257/48
See application file for complete search history.

(56) References Cited

U.S. PATENT DOCUMENTS

| | | |
|---|---|---|
| 9,184,153 B2 | 11/2015 | Lu et al. |
| 9,343,361 B2 | 5/2016 | Lee et al. |
| 2003/0017647 A1 | 1/2003 | Kwon et al. |
| 2005/0073055 A1 | 4/2005 | Pan et al. |
| 2007/0037379 A1 | 2/2007 | Enquist et al. |
| 2010/0007001 A1 | 1/2010 | Wang et al. |
| 2010/0148316 A1 | 6/2010 | Kim et al. |
| 2011/0062592 A1 | 3/2011 | Lee et al. |
| 2011/0204505 A1 | 8/2011 | Pagaila et al. |
| 2012/0217610 A1 | 8/2012 | Hopper et al. |
| 2013/0210199 A1 | 8/2013 | Chen et al. |
| 2013/0256830 A1* | 10/2013 | Barth, Jr. .......... H01L 21/76254 257/E21.546 |
| 2013/0271331 A1 | 10/2013 | Redd |
| 2014/0065821 A1* | 3/2014 | Kawa ................ H01L 21/76898 438/667 |
| 2014/0232013 A1* | 8/2014 | Wu ....................... H01L 23/528 438/638 |
| 2014/0295621 A1 | 10/2014 | Guzek et al. |
| 2014/0321803 A1 | 10/2014 | Thacker et al. |
| 2015/0021784 A1 | 1/2015 | Lin |
| 2015/0137388 A1* | 5/2015 | Kim ..................... H01L 23/481 257/774 |
| 2015/0187701 A1* | 7/2015 | Tsai ........................ H01L 24/24 257/621 |
| 2015/0318246 A1 | 11/2015 | Yu et al. |
| 2015/0318263 A1* | 11/2015 | Yu ..................... H01L 23/49816 438/109 |
| 2015/0325520 A1* | 11/2015 | Yu ........................... H01L 24/08 257/774 |
| 2019/0035750 A1 | 1/2019 | Han et al. |
| 2019/0148343 A1 | 5/2019 | Yu et al. |

FOREIGN PATENT DOCUMENTS

| | | |
|---|---|---|
| CN | 103311230 A | 9/2013 |
| CN | 103975428 A | 8/2014 |
| CN | 104752378 A | 7/2015 |
| DE | 102011054908 A1 | 5/2012 |
| DE | 102011090085 A1 | 8/2012 |
| KR | 20080039899 A | 5/2008 |
| TW | 200514216 A | 4/2005 |
| TW | 201327740 A1 | 7/2013 |
| TW | 201338126 A | 9/2013 |
| TW | 201539696 A | 10/2015 |

\* cited by examiner

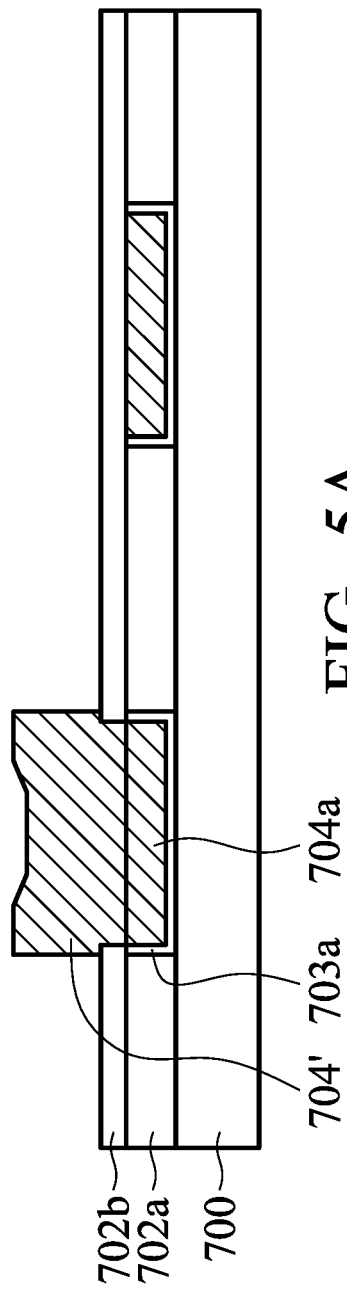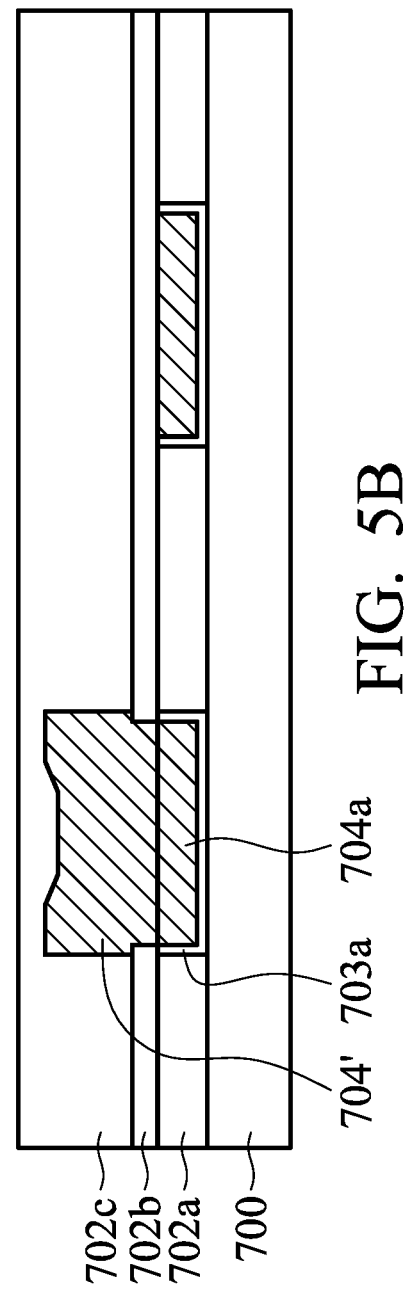

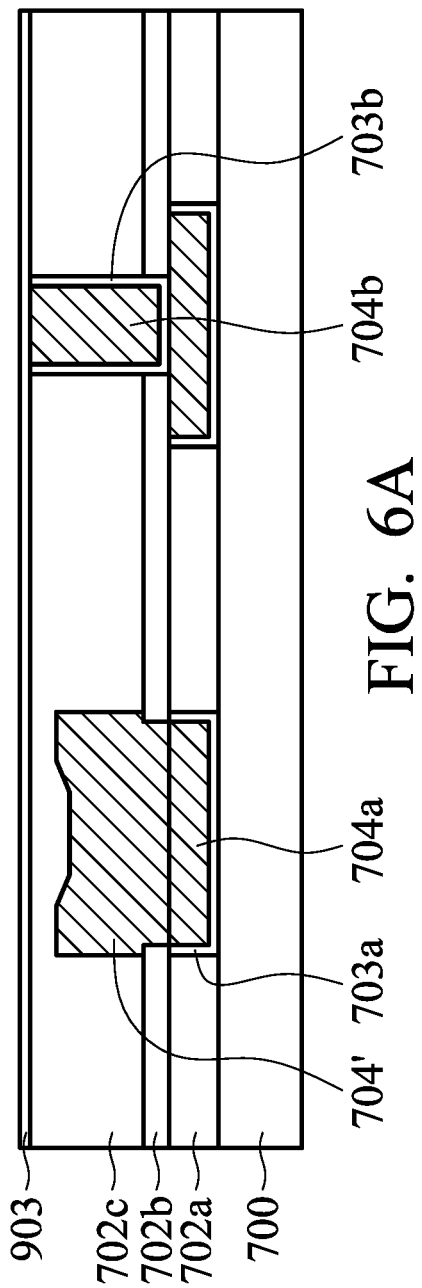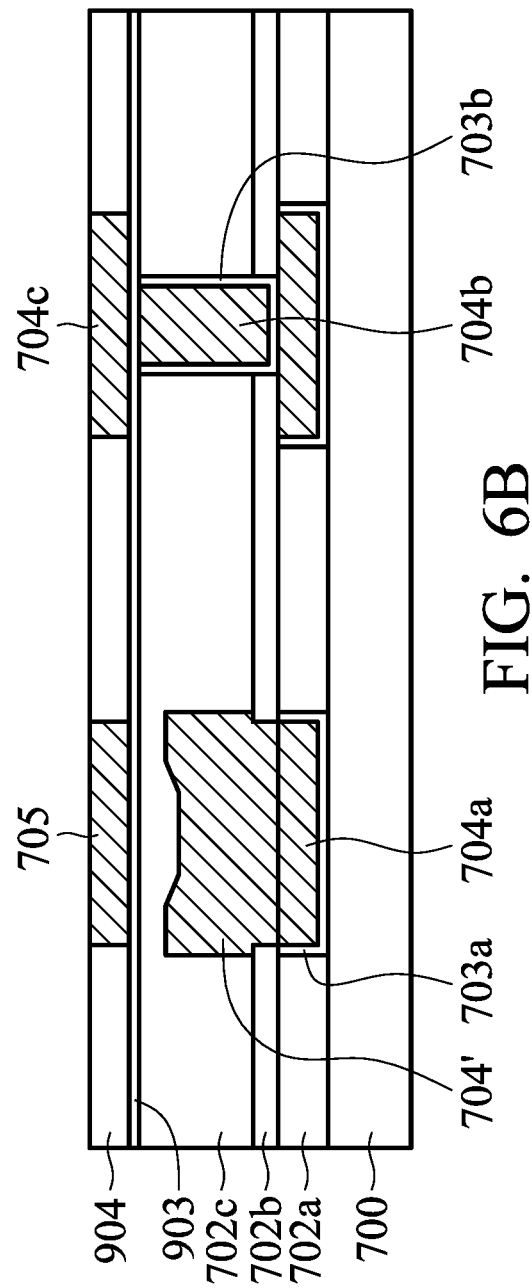

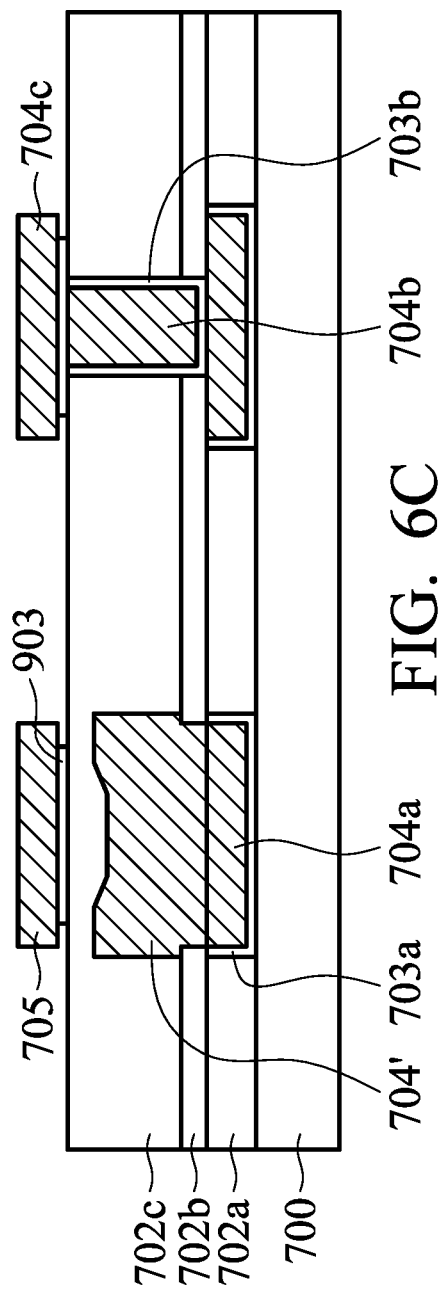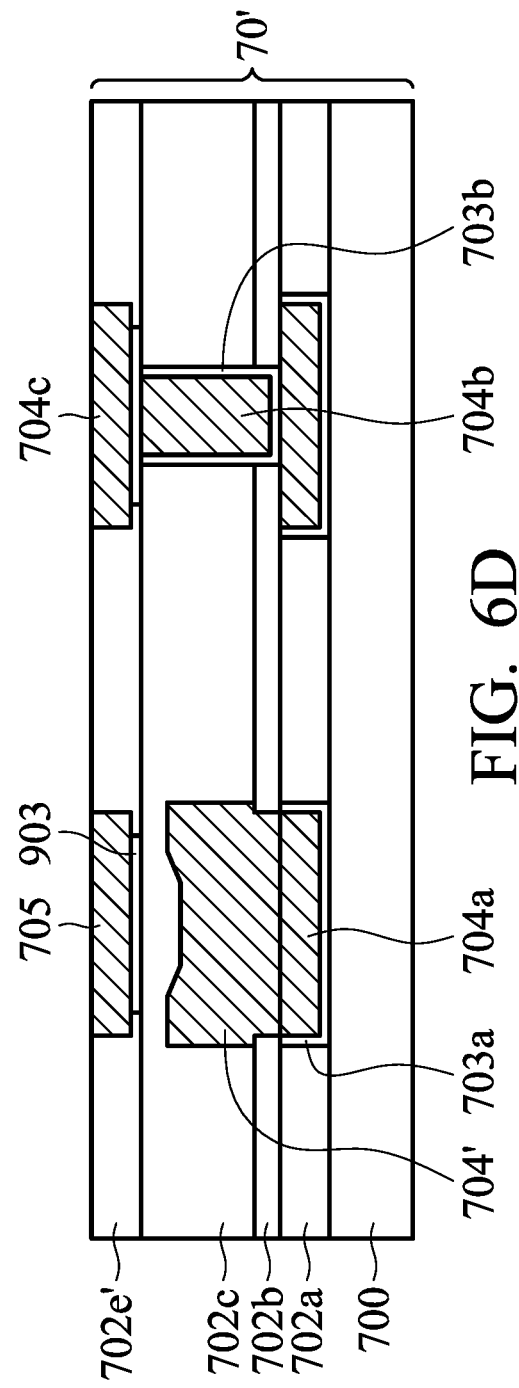
FIG. 6C
FIG. 6D

STACKED CHIP PACKAGE AND METHODS OF MANUFACTURE THEREOF

PRIORITY CLAIM AND CROSS-REFERENCE

This application is a continuation of application Ser. No. 16/225,665 filed on Dec. 19, 2018, now Pat. No. 10,840,217 issued Nov. 17, 2020, which is a continuation of U.S. patent application Ser. No. 14/919,378, entitled, "Structure and Formation Method for Chip Package," filed on Oct. 21, 2015, now Pat. No. 10,163,859 issued Dec. 25, 2018, which application is hereby incorporated herein by reference.

BACKGROUND

Semiconductor devices are used in a variety of electronic applications, such as personal computers, cell phones, digital cameras, and other electronic equipment. The fabrication of semiconductor devices involves sequentially depositing insulating or dielectric layers, conductive layers, and semiconductor layers over a semiconductor substrate, and patterning the various material layers using lithography and etching processes to form circuit components and elements on the semiconductor substrate.

The semiconductor industry continues to improve the integration density of various electronic components (e.g., transistors, diodes, resistors, capacitors, etc.) by continual reductions in minimum feature size, which allows more components to be integrated into a given area. The number of input and output (I/O) connections is significantly increased. Smaller package structures, that utilize less area or smaller heights, are developed to package the semiconductor devices. For example, in an attempt to further increase circuit density, three-dimensional (3D) ICs have been investigated.

New packaging technologies have been developed to improve the density and functionality of semiconductor devices. These relatively new types of packaging technologies for semiconductor devices face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 5A-5F are cross-sectional views of various stages of a process for forming a chip package, in accordance with some embodiments.

FIGS. 6A-6E are cross-sectional views of various stages of a process for forming a chip package, in accordance with some embodiments.

DETAILED DESCRIPTION

Figure 1A:
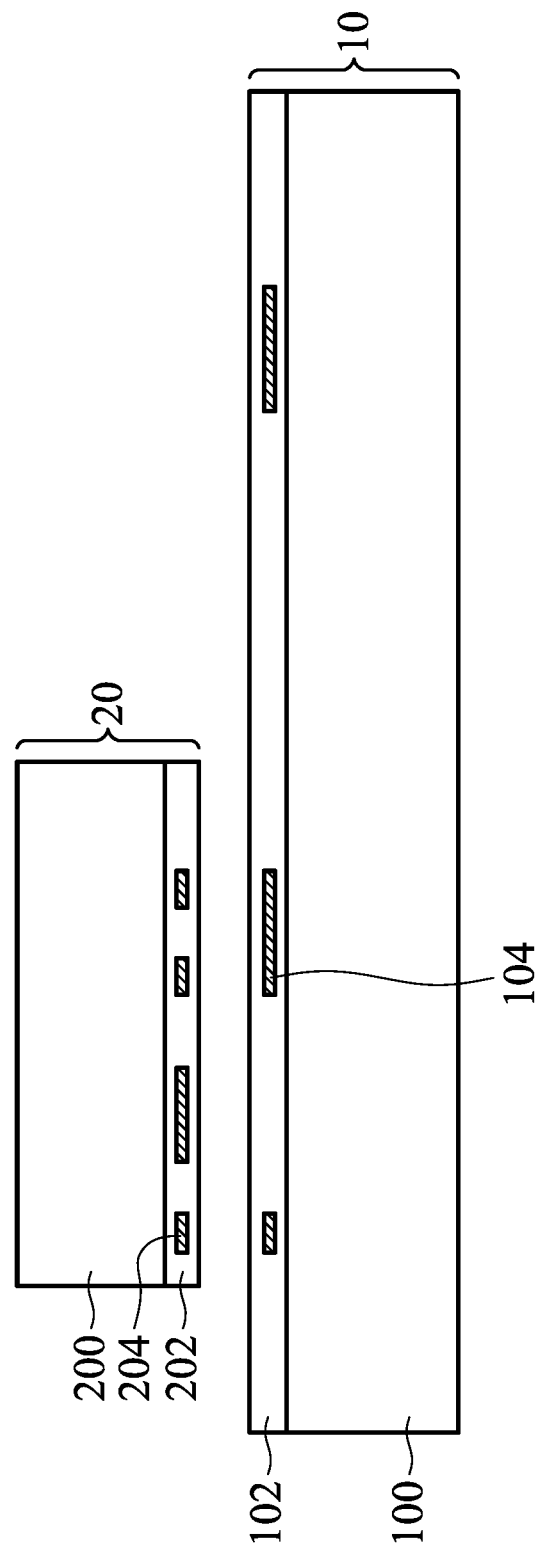
FIGS. 1A-1O are cross-sectional views of various stages of a process for forming a chip package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1O are cross-sectional views of various stages of a process for forming a chip package, in accordance with some embodiments. Additional operations can be provided before, during, and/or after the stages described in FIGS. 1A-1O. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

As shown in FIG. 1A, a substrate 10 and a semiconductor die 20 to be bonded on the substrate 10 are provided. In some embodiments, the substrate 10 includes a semiconductor wafer, a portion of a semiconductor wafer, a dielectric wafer, a portion of a dielectric wafer, another suitable substrate, or a combination thereof. The semiconductor wafer (such as a silicon wafer) may contain device elements such active devices and/or passive devices. In some other embodiments, the semiconductor wafer does not contain any device element. For example, the semiconductor wafer is a blank silicon wafer. The dielectric wafer may include a glass wafer. In some other embodiments, there are one or more other semiconductor dies (not shown) that have been bonded on the substrate 10.

In some embodiments, the substrate 10 includes a semiconductor substrate 100 and an interconnection structure formed on the semiconductor substrate 100, as shown in FIG. 1A. The interconnection structure includes an interlayer dielectric layer 102 and conductive pads 104. The interlayer dielectric layer 102 includes multiple dielectric sub-layers. Multiple conductive contacts, conductive vias, and conductive lines are formed in the interlayer dielectric layer 102. Portions of the conductive lines form the conductive pads 104.

In some embodiments, the interlayer dielectric layer 102 includes a sub-layer that covers the conductive pad 104. This sub-layer may serve as a bonding layer to facilitate a subsequent bonding with the semiconductor die 20 (through, for example a fusion bonding process). In these cases, the sub-layer on the conductive pads 104 has a subsequent planar top surface. A planarization process, such as a chemical mechanical polishing (CMP) process, may be used to provide the sub-layer with the substantially planar top surface. In some other embodiments, some or all of the conductive pads 104 are exposed without being completely buried in the interlayer dielectric layer 102. The top surfaces of the conductive pads 104 may be substantially coplanar with the top surface of the interlayer dielectric layer 102.

As shown in FIG. 1A, the semiconductor die 20 includes a semiconductor substrate 200 and an interconnection structure formed on the semiconductor substrate 200. The interconnection structure includes an interlayer dielectric layer 202 and conductive pads 204. The interconnection structure of the semiconductor die 20 may be similar to the interconnection structure of the substrate 10. In some embodiments, the conductive pads 204 are buried in the interlayer dielectric layer 202. In some other embodiments, the top surfaces of the conductive pads 204 are substantially coplanar with the top surface of the interlayer dielectric layer 202.

Various device elements are formed in the semiconductor substrate 200. Examples of the various device elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, or other suitable elements. Various processes may be used to form the various device elements, including deposition, etching, implantation, photolithography, annealing, and/or other suitable processes. The device elements are interconnected through the interconnection structure of the semiconductor die 20 to form the integrated circuit device, such as a logic device, memory device (e.g., static random access memory, SRAM), radio frequency (RF) device, input/output (I/O) device, system-on-chip (SoC) device, combinations thereof, or other applicable types of devices.

Figure 1B:
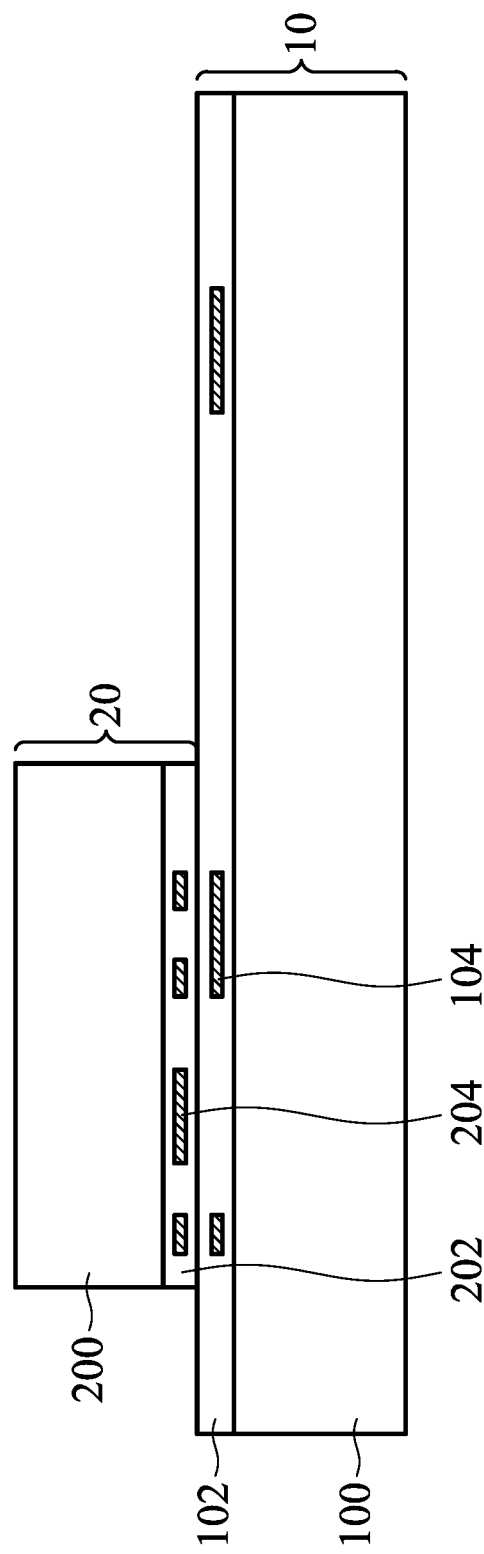

As shown in FIG. 1B, the semiconductor die 20 is bonded on the substrate 10, in accordance with some embodiments. A variety of bonding processes may be used to bond the semiconductor die 20 with the substrate 10. In some embodiments, the semiconductor die 20 and the substrate 10 are bonded together through a fusion bonding. The fusion bonding may be an oxide-to oxide bonding. In some embodiments, the semiconductor die 20 is placed over the substrate 10 such that the interlayer dielectric layers 102 and 202 are in direct contact with each other. Afterwards, a heat treatment may be used to achieve the fusion bonding between the interlayer dielectric layers 102 and 202. During the fusion bonding, the structure shown in FIG. 1B may be heated at a temperature in a range from about 150 degrees C. to about 300 degrees C.

In some other embodiments, the semiconductor die 20 and the substrate 10 are bonded together through a hybrid bonding. The hybrid bonding may include an oxide-to-oxide bonding and a metal-to-metal bonding. In some embodiments, the semiconductor die 20 is placed over the substrate 10. As a result, the interlayer dielectric layers 102 and 202 are in direct contact with each other, and some of the conductive pads 104 and 204 are in direct contact with each other. Afterwards, a heat treatment may be used to achieve the hybrid bonding between the interlayer dielectric layers 102 and 202 and between the conductive pads 104 and 204. During the hybrid bonding, the structure shown in FIG. 1B may be heated at a temperature in a range from about 300 degrees C. to about 450 degrees C.

Although the front side (wherein the interconnection structure is formed) of the semiconductor die 20 faces the substrate 10, embodiments of the disclosure are not limited thereto. In some other embodiments, the semiconductor die 20 is arranged upside down such that the back side of the semiconductor die 20 faces the substrate 10. In other words, the back side of the semiconductor die 20 is between the front side and the substrate 10. In these cases, the semiconductor substrate 200 is bonded to the interlayer dielectric layer 102. In some embodiments, a dielectric film, such as an oxide film, is formed over the semiconductor substrate 200 to facilitate bonding with the interlayer dielectric layer 102. In some embodiments, the dielectric film is a native oxide film grown on the surface of the semiconductor substrate 200.

Figure 1C:
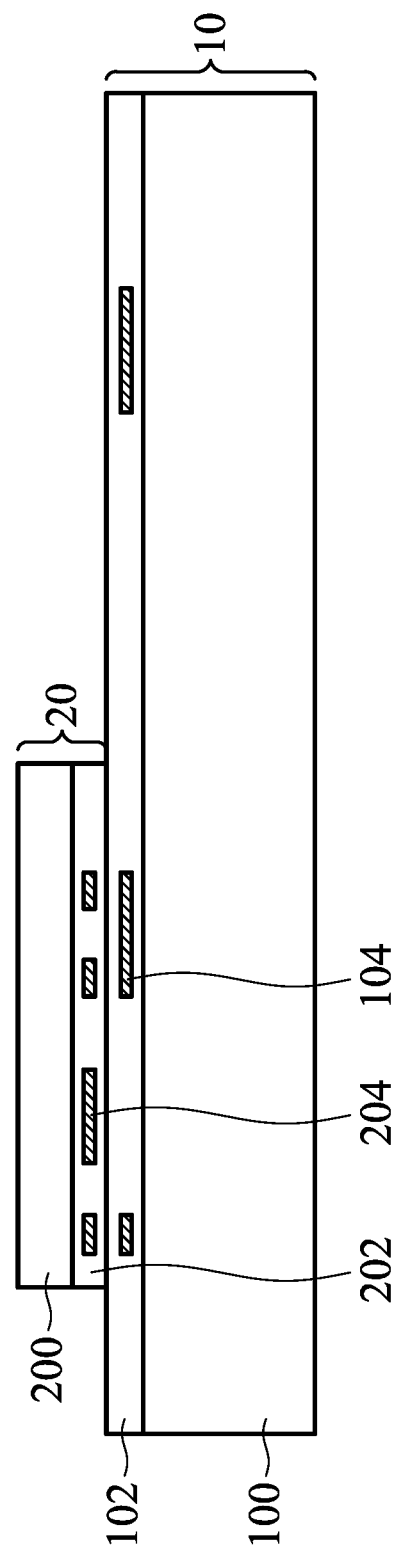

As shown in FIG. 1C, the semiconductor die 20 is thinned, in accordance with some embodiments. In some embodiments, a portion of the semiconductor substrate 200 is removed such that the semiconductor die 20 is thinned. In some embodiments, a planarization process is used to achieve the thinning of the semiconductor die 20. The planarization process may include a CMP process, a grinding process, an etching process, another applicable process, or a combination thereof.

Figure 1D:
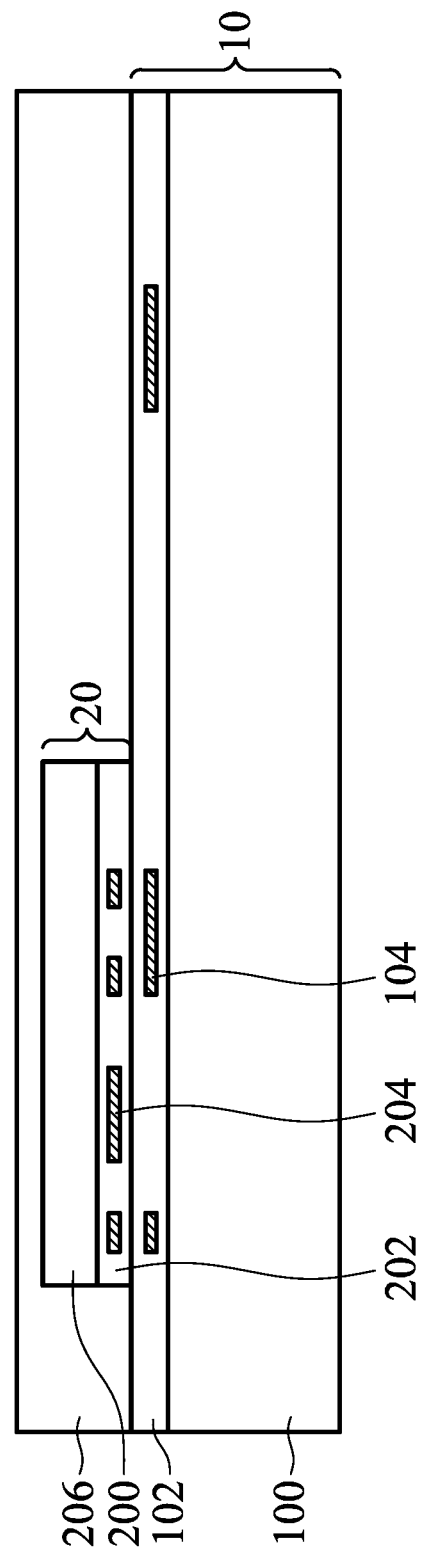

As shown in FIG. 1D, a dielectric layer 206 is deposited over the substrate 10 to encapsulate the semiconductor die 20, in accordance with some embodiments. The dielectric layer 206 surrounds and covers the semiconductor die 20. The dielectric layer 206 may be used to protect the semiconductor die 20. In some embodiments, the dielectric layer 206 is in direct contact with the semiconductor die 20. In some embodiments, the dielectric layer 206 is in direct contact with side surfaces and back surface of the semiconductor substrate 200. The structure shown in FIG. 1D may be used as a chip package. Alternatively, the structure shown in FIG. 1D may further be integrated into another package structure.

In some embodiments, the dielectric layer 206 is substantially made of a semiconductor oxide material. For example, the dielectric layer 206 is substantially made of silicon oxide. In some embodiments, a major portion of the dielectric layer 206 is made of a semiconductor oxide material, such as silicon oxide. In some embodiments, the dielectric layer 206 includes silicon oxide, silicon oxynitride, borosilicate glass (BSG), phosphoric silicate glass (PSG), borophosphosilicate glass (BPSG), fluorinated silicate glass (FSG), low-k material, another suitable material, or a combination thereof. In some embodiments, the dielectric layer 206 is a single layer. In some other embodiments, the dielectric layer 206 includes multiple sub-layers. In some embodiments, most of the sub-layers are made of a semiconductor oxide material. One or some of the sub-layers may be made of semiconductor nitride material, semiconductor oxynitride material, or semiconductor carbide material and may serve as an etch stop layer.

In some embodiments, the dielectric layer 206 is substantially free of polymer material. In some embodiments, there is no molding compound or underfill material between the dielectric layer 206 and the semiconductor die 20. Since the dielectric layer 206 is substantially free of polymer material or molding compound material, the coefficients of thermal expansion (CTE) of the dielectric layer 206, the semiconductor die 20, and the substrate 10 are similar. Therefore, warpage due to CTE mismatch may be reduced or prevented. The quality and reliability of the chip package are improved.

In some embodiments, the dielectric layer 206 is deposited using a vapor deposition process. The vapor deposition process may include a chemical vapor deposition (CVD) process, an atomic layer deposition (ALD) process, a physical vapor deposition (PVD) process, another applicable process, or a combination thereof. In some embodiments, a planarization process is performed to provide the dielectric layer 206 with a substantially planar top surface. The planarization process may include a CMP process, a grinding process, an etching process, another applicable process, or a combination thereof.

However, embodiments of the disclosure are not limited thereto. In some other embodiments, the dielectric layer 206 is made of a molding compound.

Many variations and/or modifications can be made to embodiments of the disclosure. In some embodiments, one or more conductive features are formed in the chip package to provide electrical connection in vertical direction.

Figure 1E:
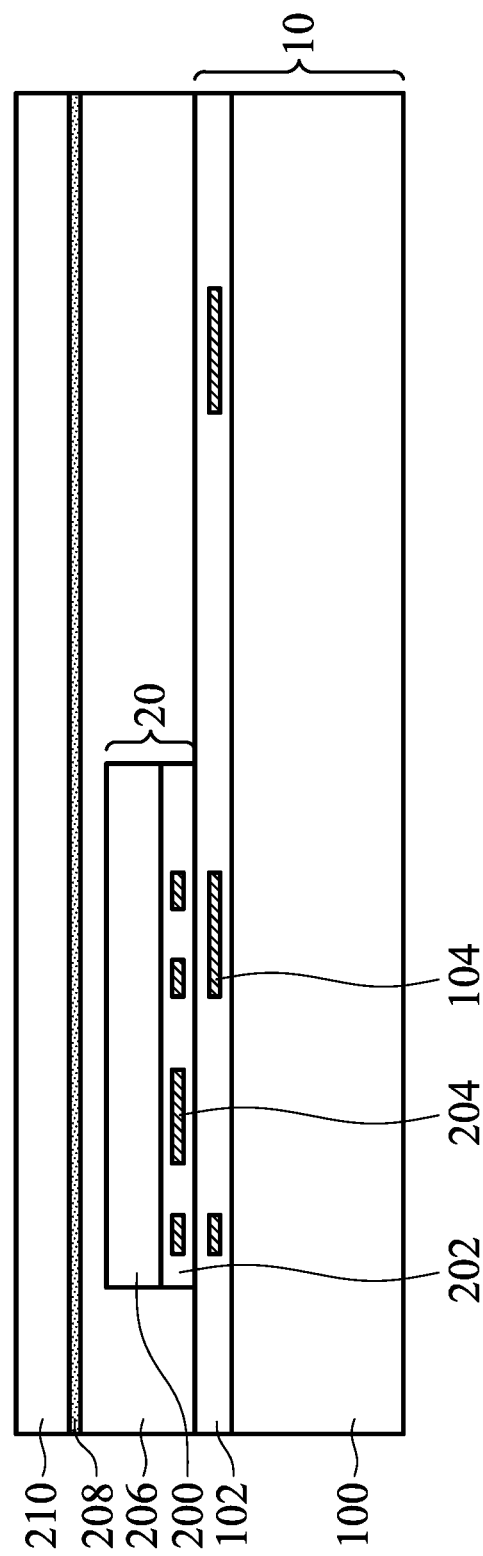

As shown in FIG. 1E, an etch stop layer 208 and a dielectric layer 210 are deposited over the dielectric layer 206, in accordance with some embodiments. The etch stop layer 208 may be made of silicon nitride, silicon oxynitride, silicon carbide, another suitable material, or a combination thereof. The dielectric layer 210 may be made of a material that is similar to or the same as that of the dielectric layer 206. In some embodiments, each of the etch stop layer 208 and the dielectric layer 210 is deposited using a CVD process, an ALD process, a PVD process, another applicable process, or a combination thereof. In some other embodiments, the etch stop layer 208 and/or the dielectric layer 210 are/is not formed.

Figure 1F:
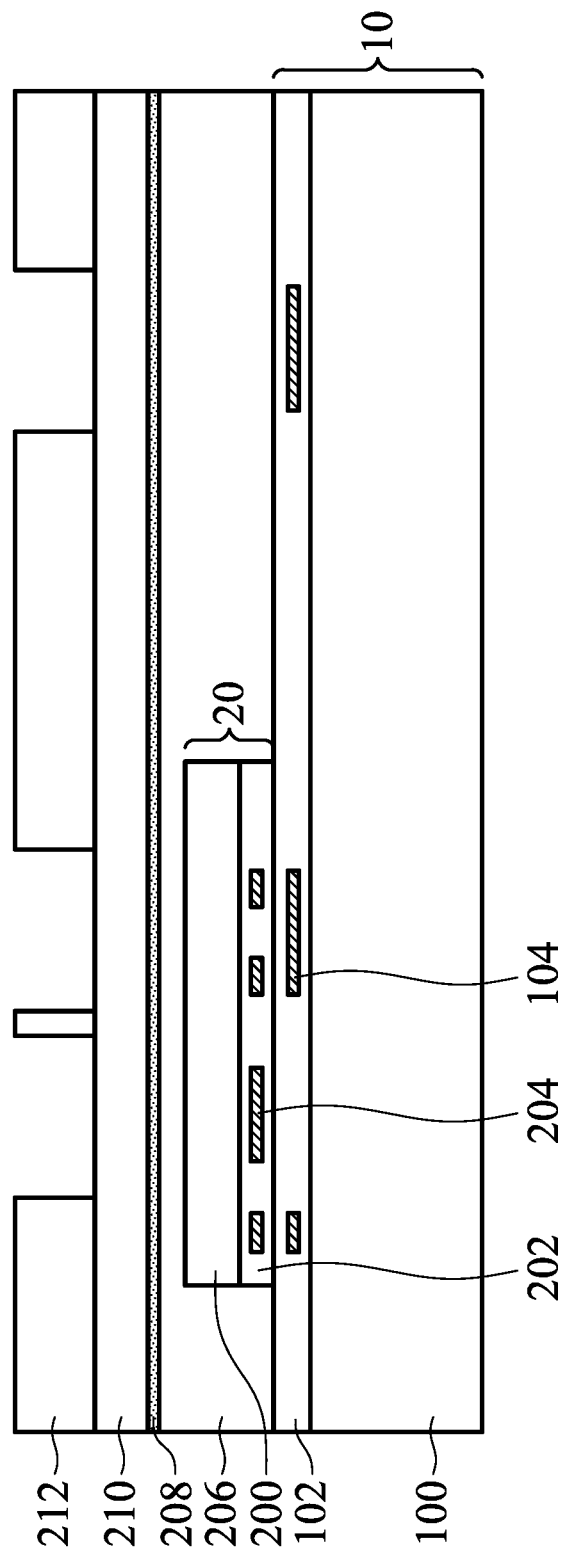

As shown in FIG. 1F, a patterned mask layer 212 is formed over the dielectric layer 210, in accordance with some embodiments. The mask layer 212 may be a photoresist layer and is patterned using a photolithography process. As shown in FIG. 1F, the patterned mask layer 212 includes openings corresponding to positions that are designed for forming conductive features.

Figure 1G:
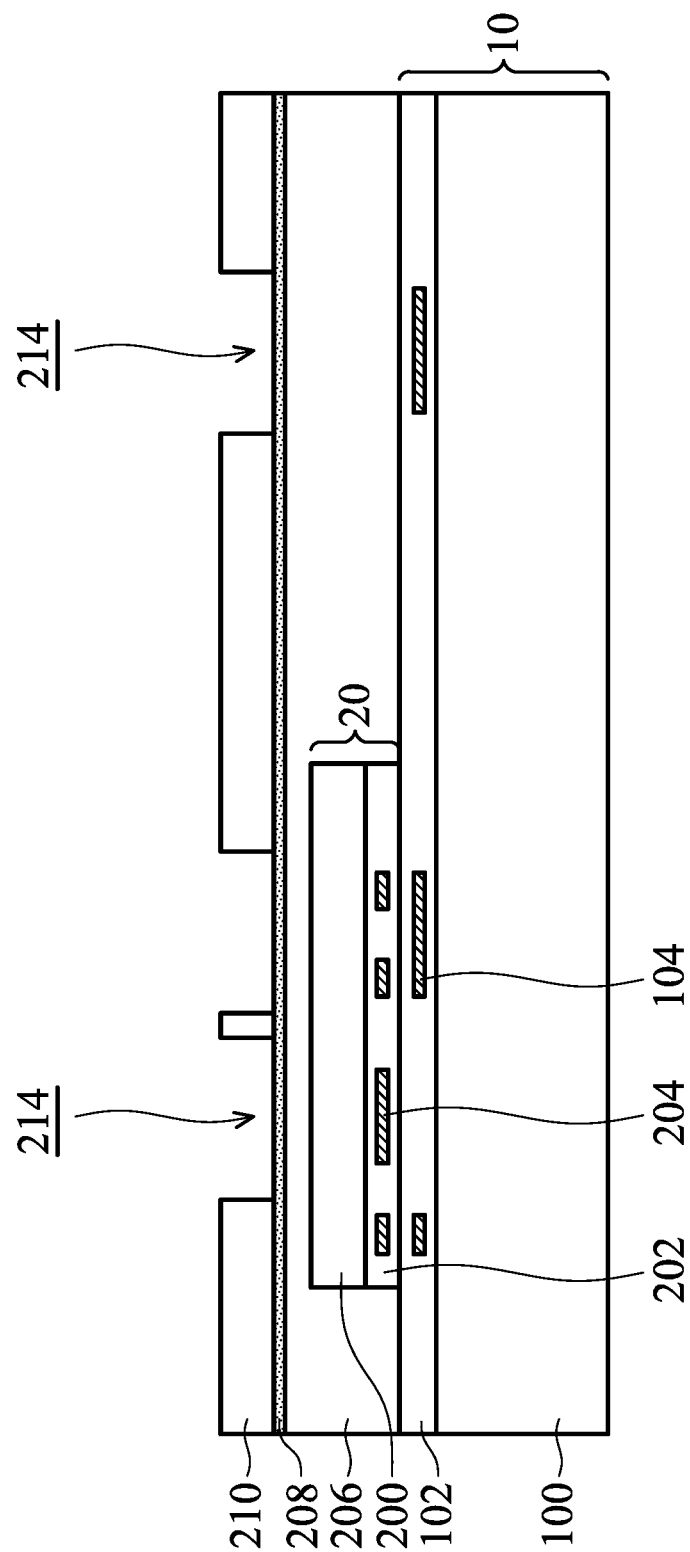

As shown in FIG. 1G, a portion of the dielectric layer 210 is removed to form openings 214 that expose the etch stop layer 208, in accordance with some embodiments. The dielectric layer 210 may be partially removed using an etching process through the openings of the patterned mask layer 212. Afterwards, the patterned mask layer 212 is removed.

Figure 1H:
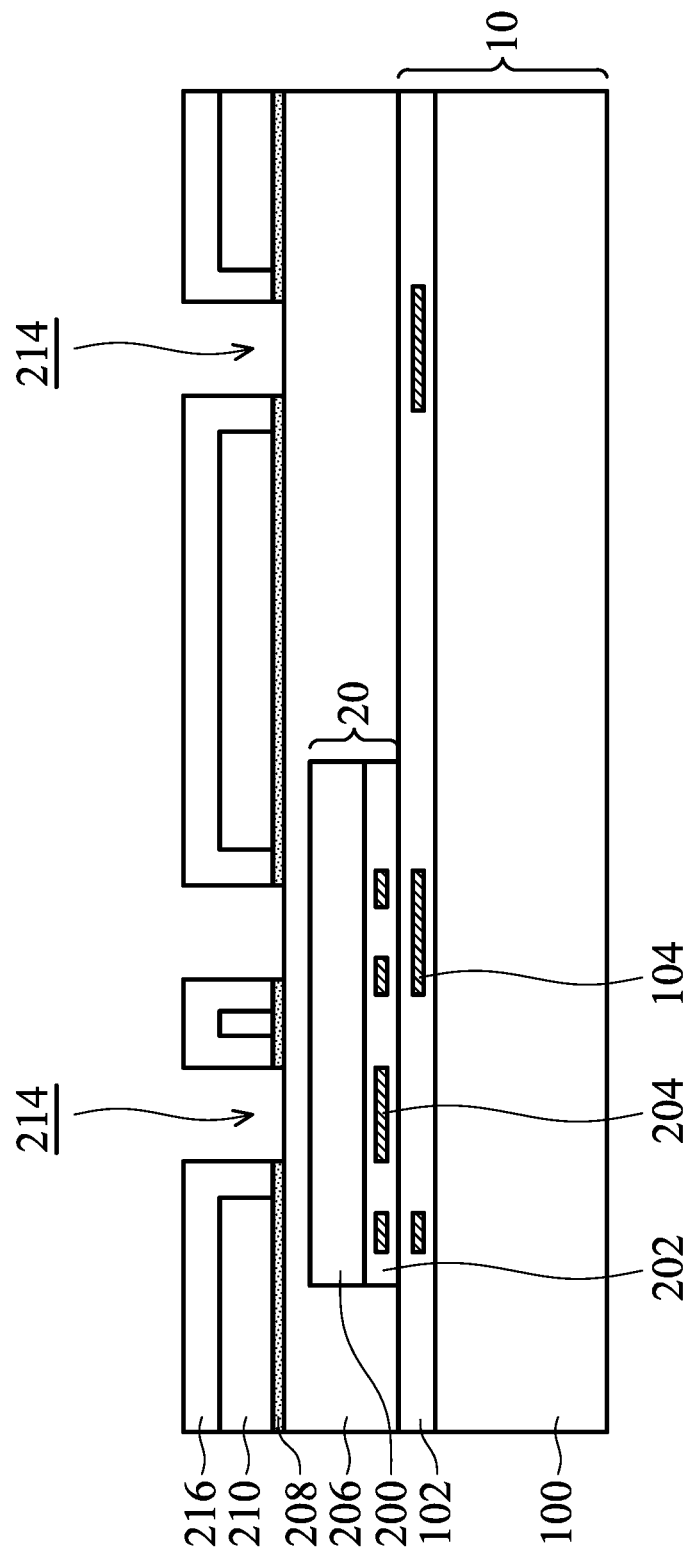

As shown in FIG. 1H, another patterned mask layer 216 is formed over the dielectric layer 210 and the etch stop layer 208 exposed by the opening 214, in accordance with some embodiments. The material and formation method of the patterned mask layer 216 may be similar to those of the patterned mask layer 212. The patterned mask layer 216 has smaller openings that partially expose the etch stop layer 208. Afterwards, the exposed portion of the etch stop layer 208 is removed, as shown in FIG. 1H.

Figure 1I:
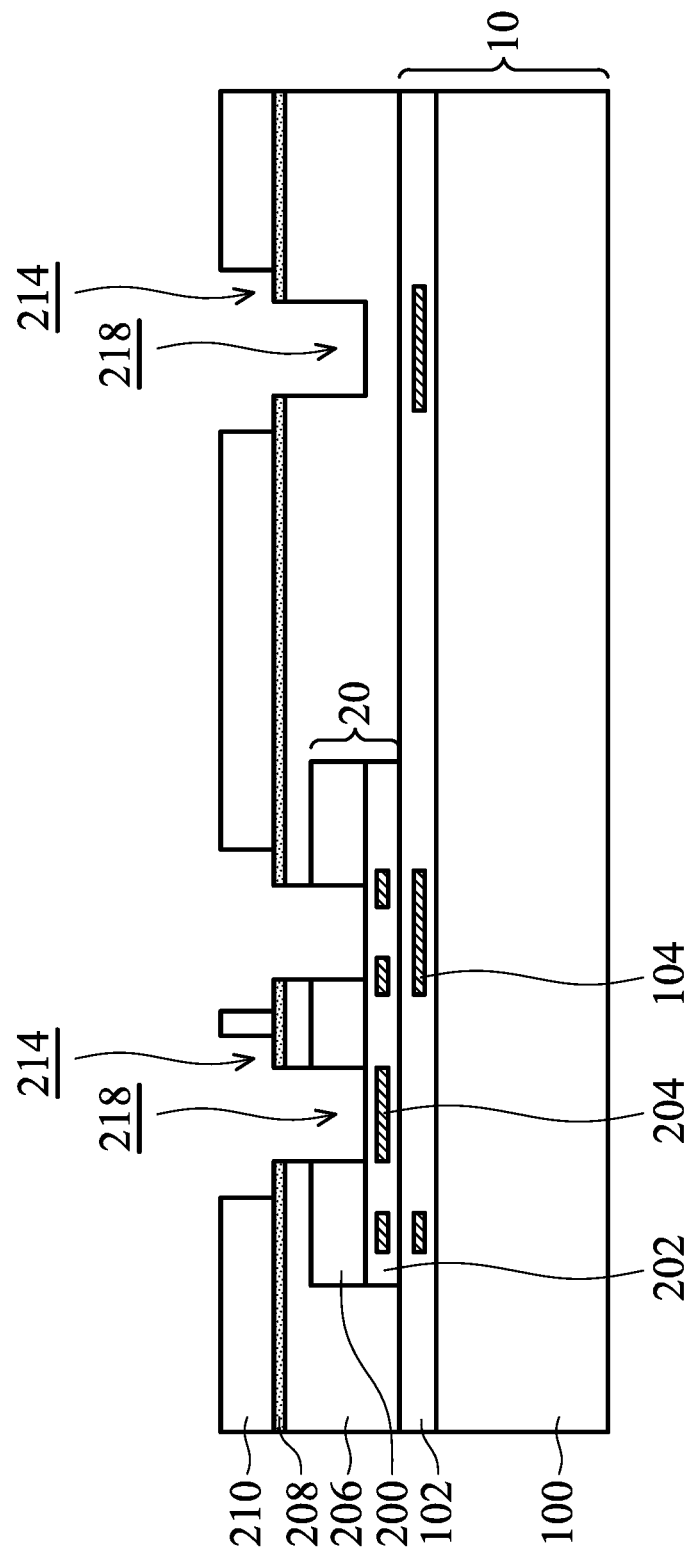

As shown in FIG. 1I, a portion of the dielectric layer 206 and a portion of the semiconductor substrate 200 are removed to form openings 218, in accordance with some embodiments. Some of the openings 218 expose the interconnection structure of the semiconductor die 20, such as the interlayer dielectric layer 202. The openings 218 are formed using an etching process through the openings of the patterned mask layer 216. In some embodiments, each of the openings 214 connects with a corresponding one of the openings 218. In some embodiments, each of the openings 214 is wider than the corresponding one of the openings 218. Afterwards, the patterned mask layer 216 is removed.

Figure 1J:
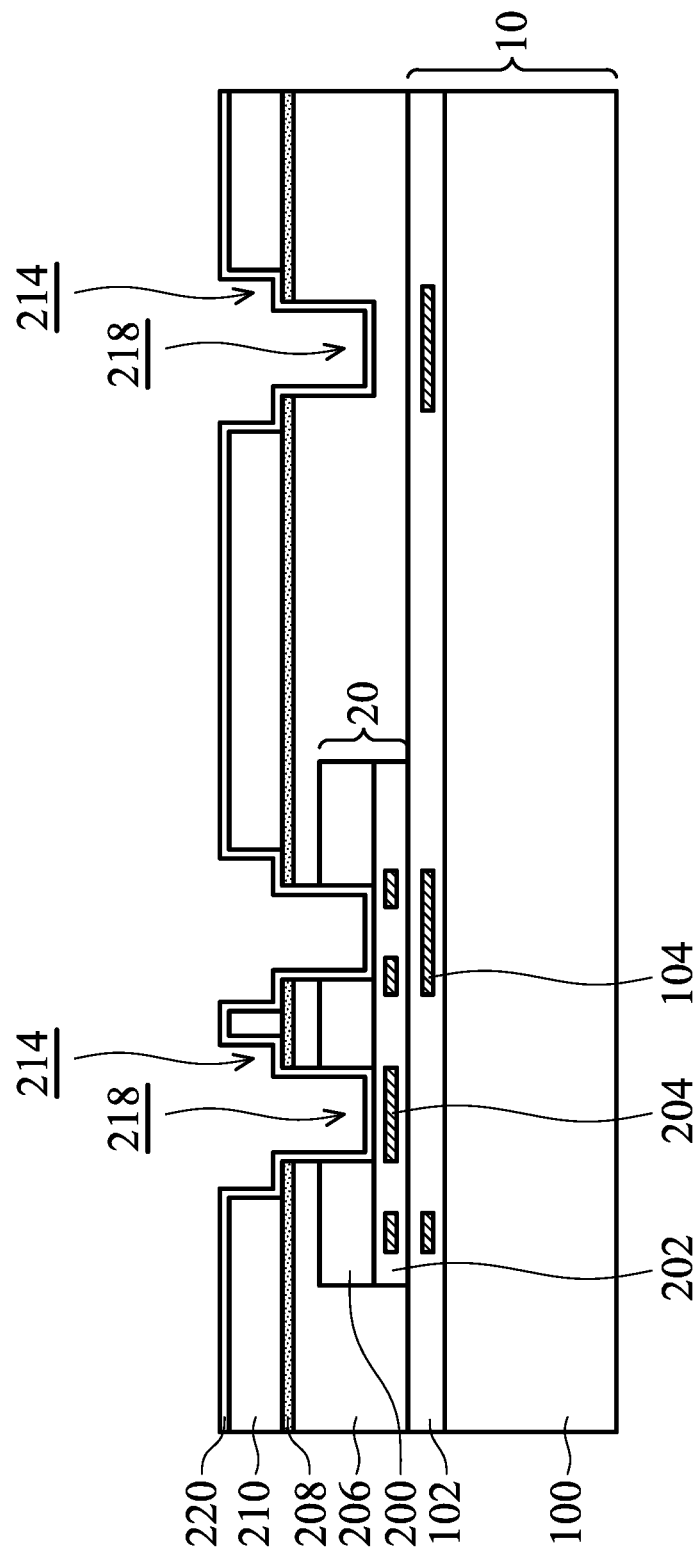

As shown in FIG. 1J, an insulating layer 220 is deposited over the dielectric layer 210 and sidewalls and bottoms of the openings 214 and 218, in accordance with some embodiments. The insulating layer 220 may be made of silicon oxynitride, silicon oxide, silicon nitride, silicon carbide, another suitable material, or a combination thereof. The insulating layer 220 may be deposited using a CVD process, a PVD process, a spin-on process, another applicable process, or a combination thereof.

Figure 1K:
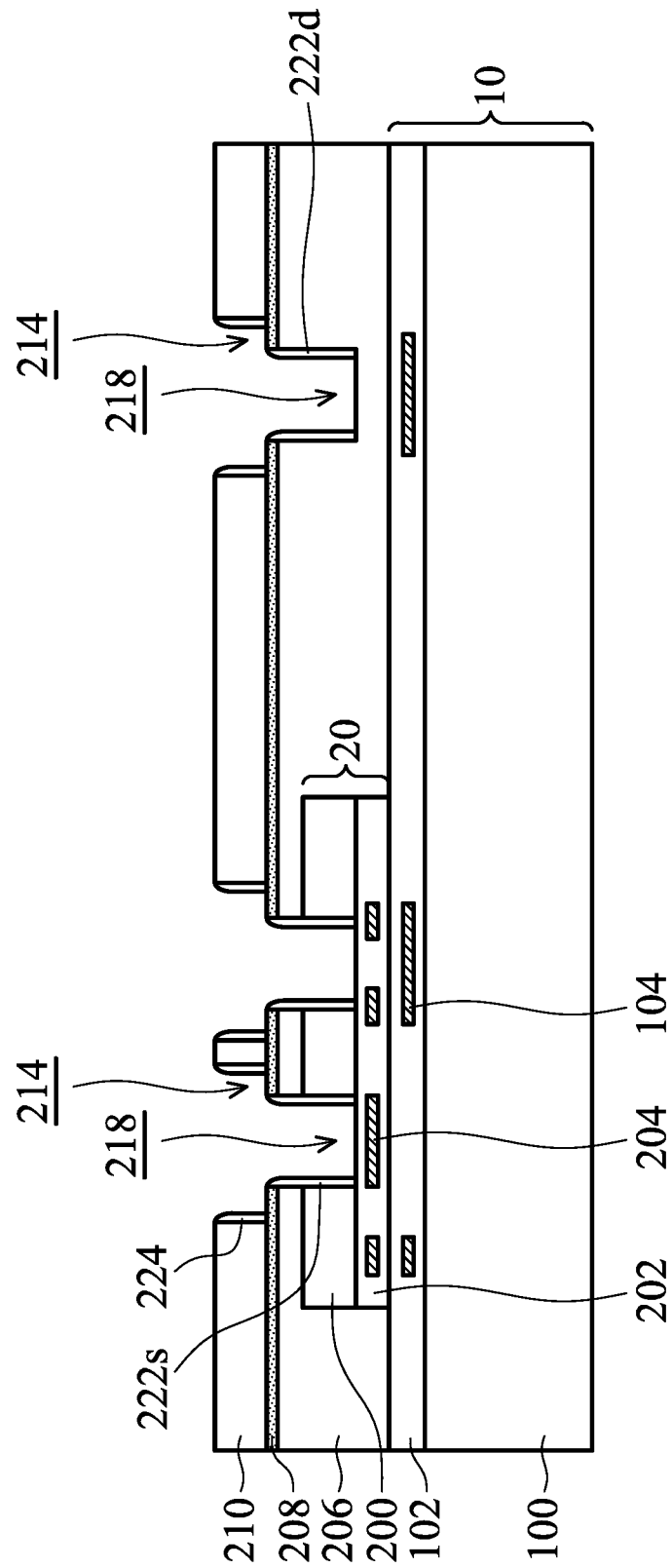

As shown in FIG. 1K, the insulating layer 220 is partially removed to form insulating elements 222s, 222d, and 224, in accordance with some embodiments. The insulating elements 222s may be used to provide electrical isolation between the semiconductor substrate 200 and conductive features to be subsequently formed in the openings 218. In some embodiments, each of the insulating elements 222s has a thickness that is not uniform. In some embodiments, each of the insulating elements 222s gradually becomes wider along a direction from the top of the insulating element 222s towards the substrate 10, as shown in FIG. 1K. In some other embodiments, the thicknesses of the insulating elements 222s are substantially the same.

In some embodiments, an etching process (such as an anisotropic etching process) is used to partially remove the insulating layer 220. The remaining portions of the insulating layer 220 over sidewalls of the semiconductor substrate 200 in the openings 218 form the insulating elements 222s. The remaining portions of the insulating layer 220 over sidewalls of the opening 218 that does not penetrate through the semiconductor substrate 200 form the insulating elements 222d. The remaining portions of the insulating layer 220 over sidewalls of the opening 214 form the insulating elements 224. In some embodiments, the portions of the insulating layer 220 over sidewalls of the opening 214 are also removed during the etching process. In these cases, there is no insulating element formed over sidewalls of the opening 214.

Figure 1L:
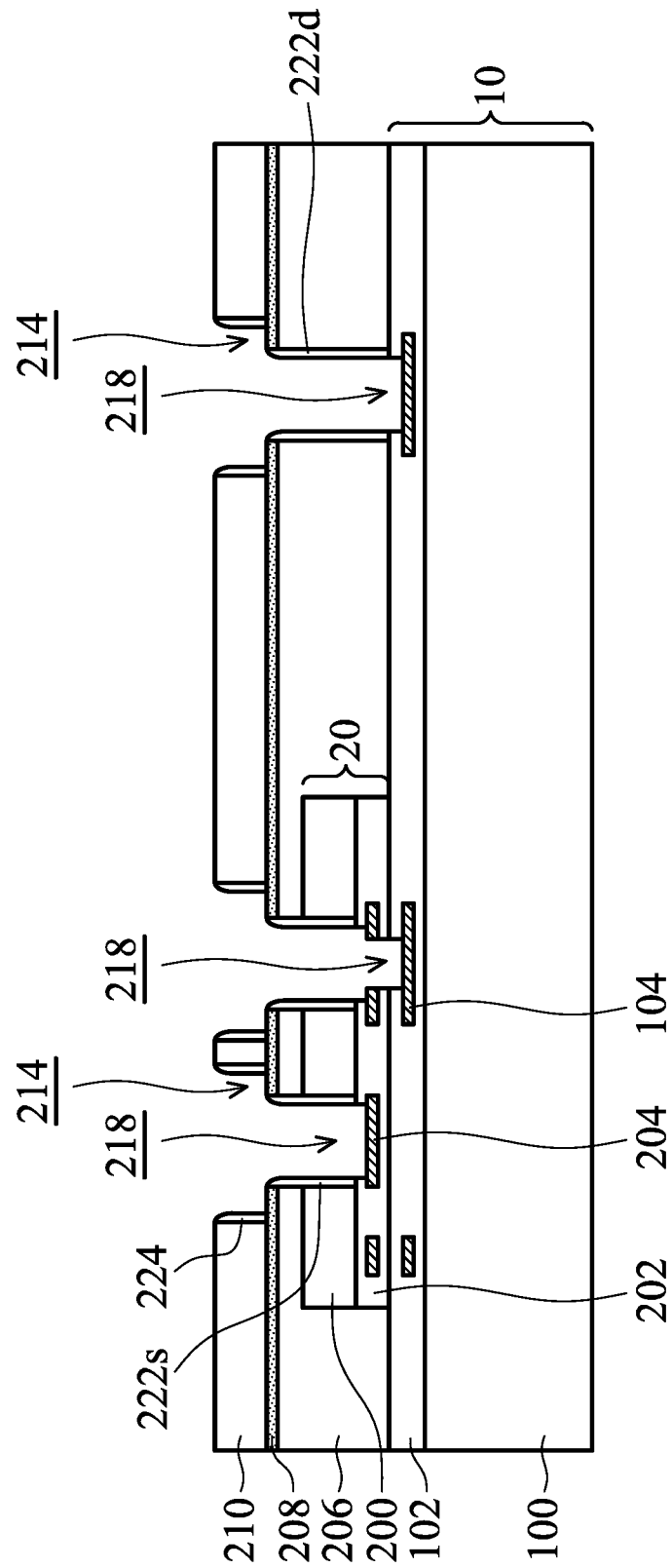

As shown in FIG. 1L, an etching process is used to further extend the openings 218 towards the substrate 10, in accordance with some embodiments. During the etching process, portions of the interlayer dielectric layers 202 and 102 are removed. As a result, some of the conductive pads 204 of the semiconductor die 20 and some of the conductive pads 104 of the substrate 10 are exposed. In some embodiments, the insulating elements 222s are made of a material that is different from those of the interlayer dielectric layers 202 and 102. Therefore, the insulating elements 222s may still remain to cover and protect the semiconductor substrate 200 after the etching process.

Figure 1M:
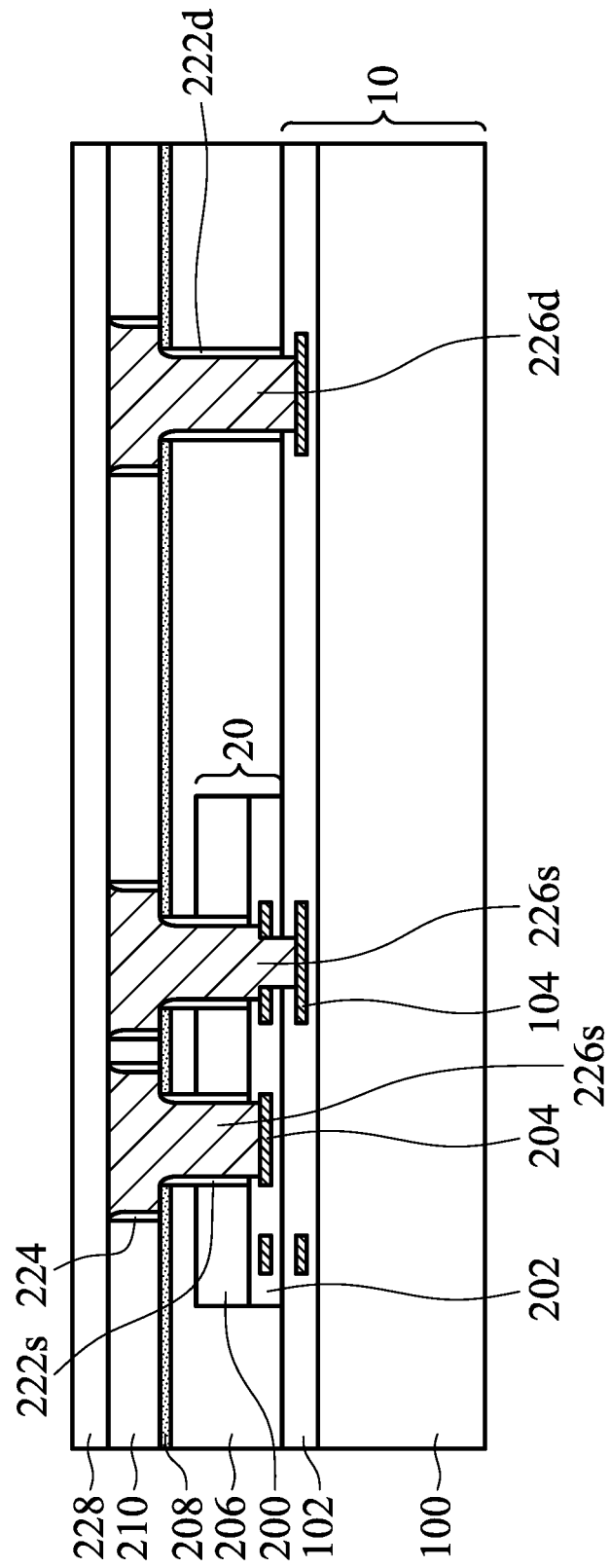

As shown in FIG. 1M, conductive features 226s and 226d are formed in the openings 214 and 218, in accordance with some embodiments. As shown in FIG. 1M, one of the conductive features 226s penetrates through the semiconductor substrate 200 and is in electrical contact with one of the conductive pads 204. In some embodiments, one of the conductive features 226s penetrates through the semiconductor substrate 200 and the interconnection structure of the semiconductor die 20 and is in electrical contact with one of the conductive pads 104. As mentioned above, the insulating elements 222s may be used to provide electrical isolation between the semiconductor substrate 200 and conductive features 226s. In some embodiments, one of the conductive features 226s serves as a through-via that physically connects one of the conductive pads 104 of the substrate 10 (such as a semiconductor chip). In these cases, one of the conductive features 226s completely penetrates through the semiconductor die 20. In some embodiments, the conductive feature 226d penetrates through the dielectric layers 210 and 206 and is in electrical contact with one of the conductive pads 104, as shown in FIG. 1M.

In some embodiments, each of the conductive features 226s and 226d includes a barrier layer and a conductive layer. The barrier layer may be made of Ta, TaN, Ti, TiN, another suitable material, or a combination thereof. The barrier layer may be a stack of multiple sub-layers, such as a stack of TaN/Ta or TiN/Ti. The conductive layer may be made of Cu, Al, W, Au, Pt, another suitable material, or a combination thereof. In some embodiments, a seed layer is formed over the barrier layer before the formation of the conductive layer. The seed layer may include a Cu layer.

In some embodiments, the barrier layer is deposited over the dielectric layer 210, the conductive pads 204 and 104, and sidewalls of the openings 214 and 218. The barrier layer may be deposited using a CVD process, a PVD process, another applicable process, or a combination thereof. Afterwards, the seed layer is deposited over the barrier layer using, for example, a PVD process (such as sputtering), a CVD process, another application process, or a combination thereof. Then, the conductive layer is deposited over the seed layer using, for example, an electroplating process. A planarization process is performed afterwards to remove the portions of the barrier layer, the seed layer, and the conductive layer outside of the openings 214 and 218. The planarization process may include a CMP process, a grinding process, an etching process, another applicable process, or a combination thereof. As a result, the remaining portions of the barrier layer, the seed layer, and the conductive layer form the conductive features 226s and 226d, as shown in FIG. 1M.

Afterwards, a bonding layer 228 is deposited over the dielectric layer 210 and the conductive features 226s and 226d, as shown in FIG. 1M in accordance with some embodiments. The bonding layer 228 is used to facilitate a subsequent bonding with one or more other semiconductor dies. The material and formation method of the bonding layer 228 may be similar to those of the interlayer dielectric layer 102 or 202. In some other embodiments, the bonding layer 228 is not formed.

Figure 1N:
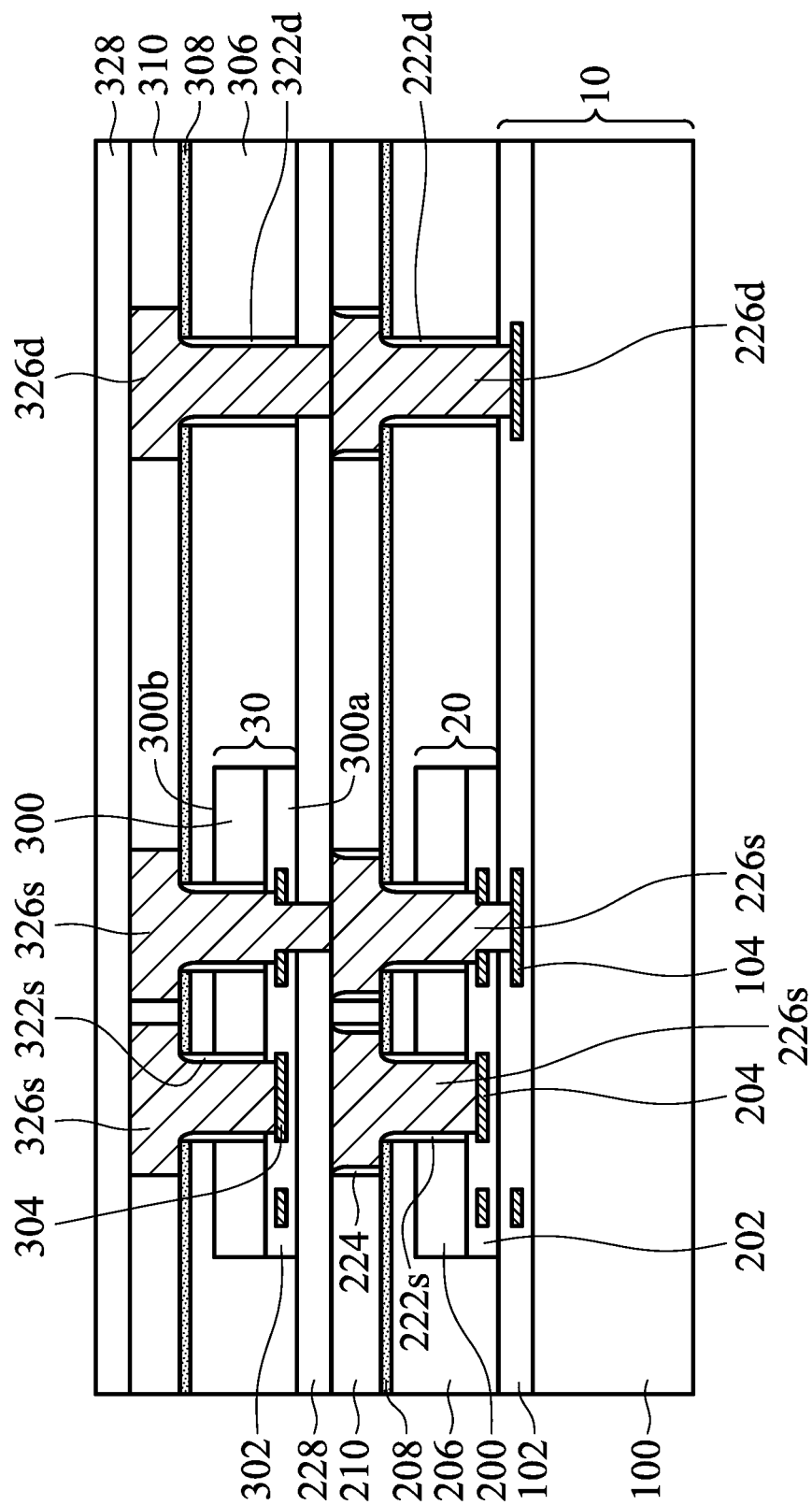
Figure 1O:
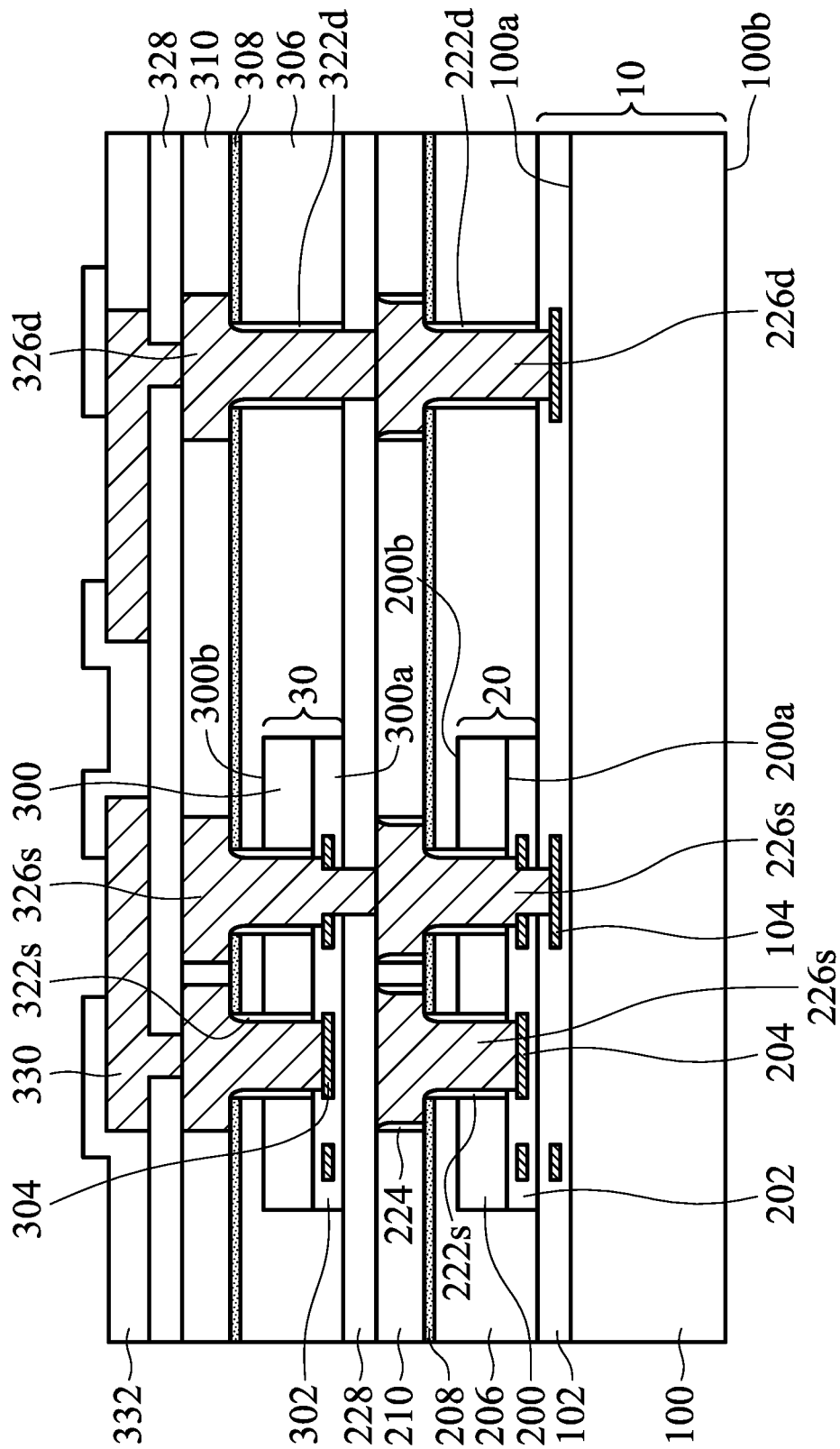

Afterwards, in a way that is similar to the operations shown in FIGS. 1A-1C, a semiconductor die 30 is bonded over the semiconductor die 20 through the bonding layer 228, as shown in FIG. 1N in accordance with some embodiments. In some embodiments, the bonding layer 228 is in direct contact with an interlayer dielectric layer 302 of the semiconductor die 30. The bonding layer 228 and the interlayer dielectric layer 302 are bonded together through a type of fusion bonding (such as oxide-to-oxide bonding). In some other embodiments, the bonding layer 228 is not formed, and the top of one of the conductive features 226s is in direct contact with a conductive pad 304 of the semiconductor die 30. In these cases, the semiconductor die 30 is bonded over the semiconductor die 20 through a type of hybrid bonding that includes, for example, an oxide-to-oxide bonding and a metal-to-metal bonding.

Although the front side (where the interconnection structure is formed) of the semiconductor die 30 faces the substrate 10 and/or the semiconductor die 20, embodiments of the disclosure are not limited thereto. In some other embodiments, the back side of the semiconductor die 30 faces the substrate 10 and/or the semiconductor die 20. In other words, the back side of the semiconductor die 30 is between the front side of the semiconductor die 30 and the substrate 10. In these cases, a semiconductor substrate 300 of the semiconductor die 30 is bonded to the bonding layer 228. In some embodiments, a dielectric film, such as an oxide film, is formed over the semiconductor substrate 300 to facilitate bonding with the bonding layer 228. The dielectric film may be a native oxide film grown on the semiconductor substrate 300.

Afterwards, in a way that is similar to the operations shown in FIG. 1D, a dielectric layer 306 is formed to encapsulate the semiconductor die 30, as shown in FIG. 1N in accordance with some embodiments. The material and formation method of the dielectric layer 306 may be similar to those of the dielectric layer 206. Afterwards, in a way that is similar to the operations shown in FIGS. 1E-1L, an etch stop layer 308 and a dielectric layer 310 are formed, and openings penetrating through the semiconductor substrate 300 and the dielectric layer 306 are formed, in accordance with some embodiments. Some of the openings expose the conductive pad 304, some of the opening exposes the conductive feature 226s, and some of the openings expose the conductive feature 226d. Insulating elements 322s and 322d may also be formed.

Afterwards, in a way that is similar to the operations shown in FIG. 1M, conductive features 326s and 326d are formed, as shown in FIG. 1N in accordance with some embodiments. In some embodiments, one of the conductive features 326s and one of the conductive features 226s together form a conductive feature penetrating through the semiconductor dies 30 and 20. In some embodiments, the conductive feature (including 226s and 326s) is in electrical contact with one of the conductive pads 104 of the substrate 10. In some embodiments, one of the conductive features 326d and one of the conductive features 226d together form a conductive feature penetrating through the dielectric layers 306 and 206. In some embodiments, the conductive feature (including 226d and 326d) is in electrical contact with one of the conductive pads 104 of the substrate 10.

Afterwards, a dielectric layer 328 is deposited over the dielectric layer 310 and the conductive features 326s and 326d, as shown in FIG. 1N in accordance with some embodiments. The dielectric layer 328 may serve as a protection layer to protect the conductive features 326s and 326d. The dielectric layer 328 may also be used as a bonding layer if more semiconductor dies are designed to be bonded on the semiconductor die 30. The material and formation method of the dielectric layer 328 may be similar to those of the bonding layer 228. Similar operations may be repeated to stack more semiconductor dies over the structure shown in FIG. 1N.

As shown in FIG. 1O, redistribution layers (RDL) 330 and a passivation layer 332 are formed over the dielectric layer 328, in accordance with some embodiments. The redistribution layers 330 may be partially exposed to provide a landing area for connectors, such as solder bumps. In some embodiments, the redistribution layers 330 are made of Cu, Al, W, Au, Ti, Pt, Co, another suitable material, or a combination thereof. In some embodiments, the passivation layer 332 is made of silicon nitride, polyimide, another suitable material, or a combination thereof.

In some embodiments, the dielectric layer 328 is patterned to expose the conductive features such as the conductive features 326s and 326d. Afterwards, a conductive layer is deposited and patterned to form the redistribution layers 330. The conductive layer may be deposited using an electroplating process, a PVD process, a CVD process, an electroless plating process, another applicable process, or a combination thereof. Afterwards, a passivation layer 332 is deposited and patterned over the dielectric layer 328 and the redistribution layers 330. A suitable deposition process, such as a CVD process or a spin-on process, may be used to deposit the passivation layer 332.

Figure 2A:
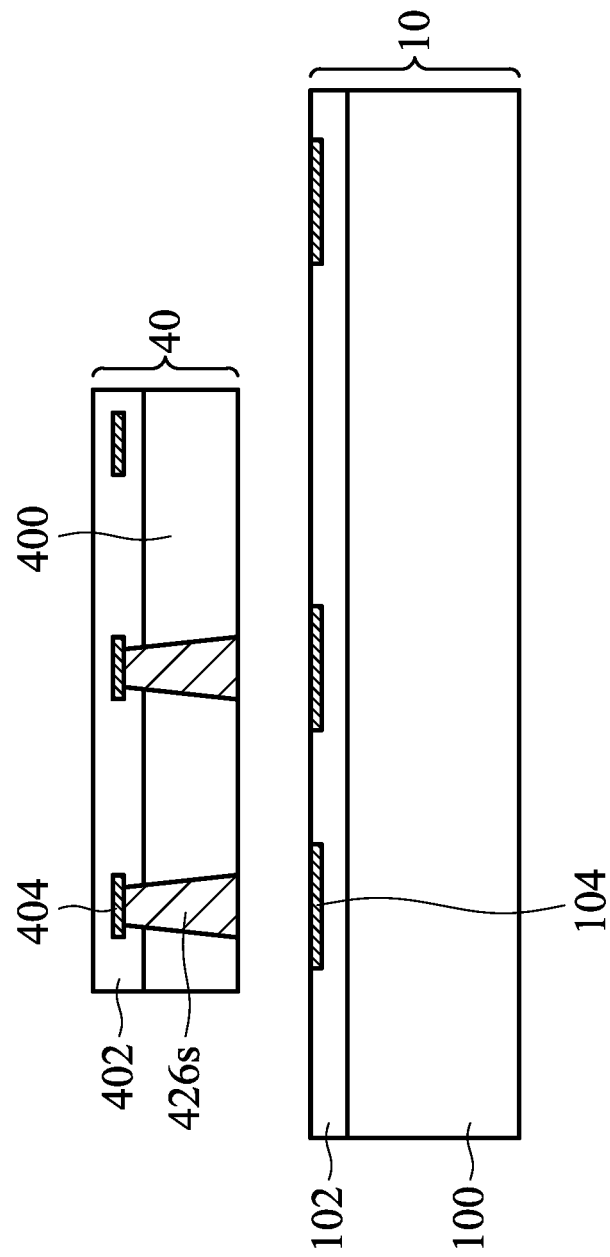
FIGS. 2A-2B are cross-sectional views of various stages of a process for forming a chip package, in accordance with some embodiments.
Figure 2B:
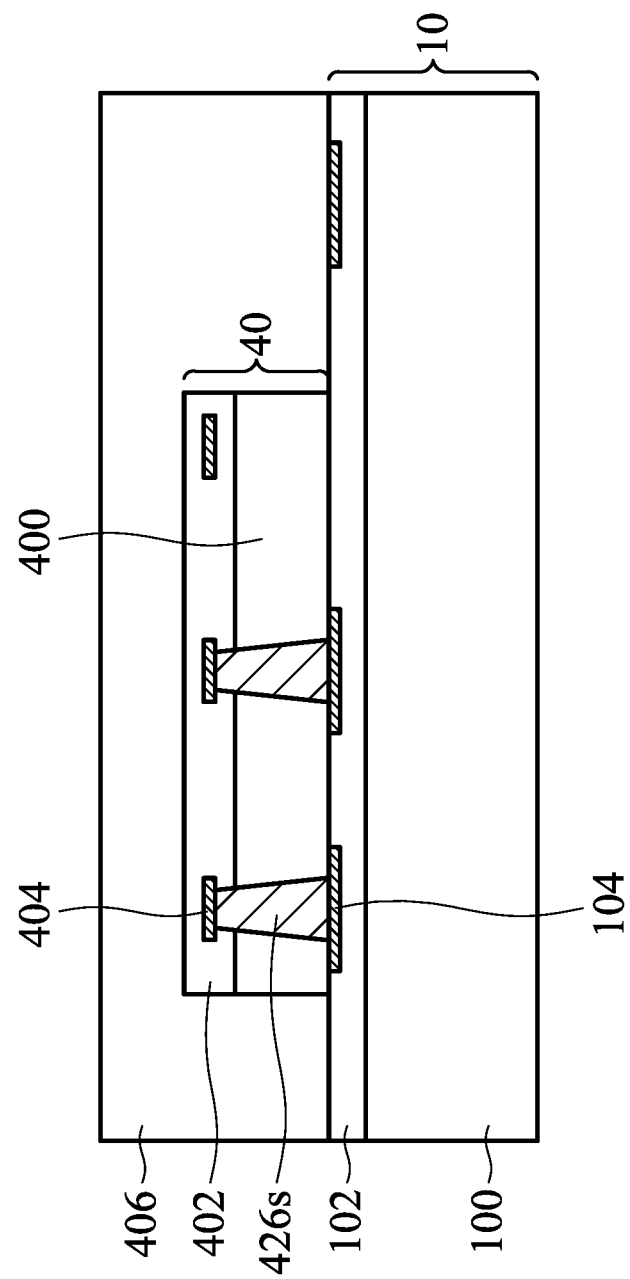

Many variations and/or modification can be made to embodiments of the disclosure. For example, the conductive features penetrating through the semiconductor die may be formed before the bonding process for stacking semiconductor dies. FIGS. 2A-2B are cross-sectional views of various stages of a process for forming a chip package, in accordance with some embodiments.

As shown in FIG. 2A, a semiconductor die 40 is provided to be bonded onto the substrate 10, in accordance with some embodiments. The semiconductor die 40 includes a semiconductor substrate 400 and an interconnection structure including an interlayer dielectric layer 402 and conductive pads 404. The semiconductor die 40 also includes one or more conductive features 426s that have been formed in the semiconductor substrate 400. The conductive features 426s may penetrate through the semiconductor substrate 400 and be electrically connected to the conductive pads 404 correspondingly. There may be insulating elements or insulating layers (not shown) formed between the conductive features 426s and the semiconductor substrate 400.

As shown in FIG. 2B, the semiconductor die 40 is bonded on the substrate 10, in accordance with some embodiments. Although the back side of the semiconductor die 40 faces the substrate 10, embodiments of the disclosure are not limited thereto. In some other embodiments, similar to the structure shown in FIG. 1B, the semiconductor die 40 is arranged such that the front side of the semiconductor die 40 faces the substrate 10. The semiconductor die 40 may be bonded on the substrate 10 through fusion bonding or hybrid bonding, as mentioned above.

Afterwards, a dielectric layer 406 is formed to encapsulate the semiconductor die 40, as shown in FIG. 2B in accordance with some embodiments. The material and formation method of the dielectric layer 406 may be similar to those of the dielectric layer 206. The structure shown in FIG. 2B may be used as a chip package or may be integrated into another package structure. In some other embodiments, one or more levels of semiconductor dies are stacked over the semiconductor die 40. Embodiments of the disclosure have many variations. In some other embodiments, the dielectric layer 406 is made of a molding compound.

Figure 3:
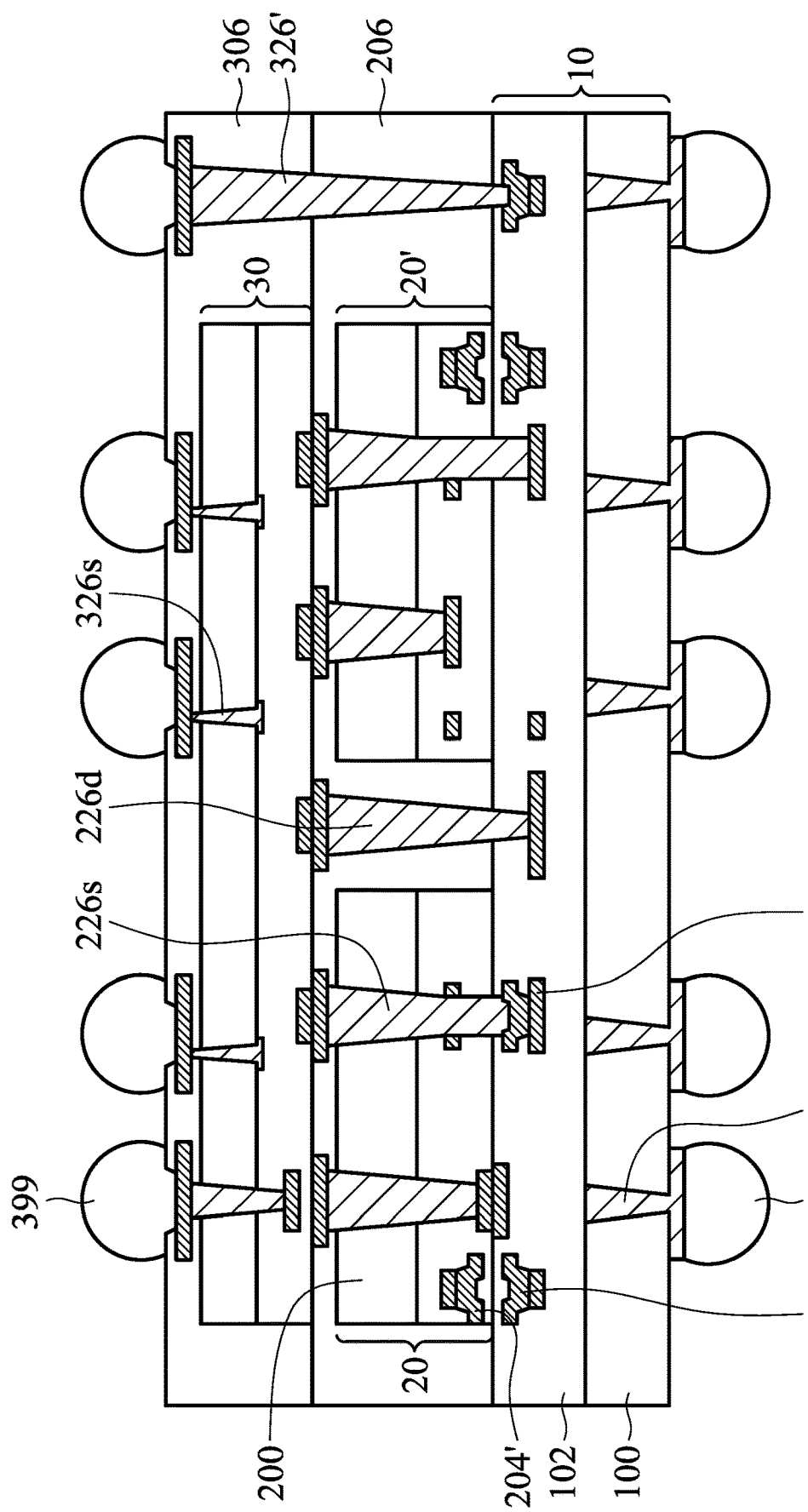
FIG. 3 is a cross-sectional view of a chip package, in accordance with some embodiments.

Many variations and/or modifications can be made to embodiments of the disclosure. FIG. 3 is a cross-sectional view of a chip package, in accordance with some embodiments. FIG. 3 shows a chip package similar to that shown in FIG. 1O. In some embodiments, the substrate 10 includes conductive features 126 penetrating through the semiconductor substrate 100. The conductive features 126 are used as through-vias and provide electrical paths between elements disposed over opposite sides of the semiconductor substrate 100. In some embodiments, each of the conductive features 126 is electrically connected to a corresponding connector 397 that is formed over the back side of the semiconductor substrate 100. In some embodiments, insulating elements (not shown) are formed between the semiconductor substrate 100 and the conductive features 126. As shown in FIG. 3, connectors 399 are formed over the semiconductor die 30, in accordance with some embodiments.

In some embodiments, a semiconductor die 20' is also stacked on the substrate 10, as shown in FIG. 3 in accordance with some embodiments. The semiconductor die 20' is positioned at substantially the same height level as the semiconductor die 20. As shown in FIG. 3, a conductive feature 326' is formed to penetrate through both of the dielectric layers 306 and 206, in accordance with some embodiments. In some embodiments, the opening containing the conductive feature 326' is formed after the bonding of the semiconductor die 30 and the formation of the dielectric layer 306.

In some embodiments, the substrate 10 and/or the semiconductor dies 20, 20', or 30 include testing pads such as testing pads 104' and/or 204'. The testing pads 104' and/or 204' are used for electrical testing. Multiple testing operations may be performed to ensure the substrate 10 and/or the semiconductor dies 20, 20', and/or 30 have good quality before they are bonded together. Therefore, the reliability and performance of the chip package are improved. In some embodiments, the testing pads 104' and/or 204' are made of Al, W, Cu, Au, Ti, another suitable material, or a combination thereof. However, it should be appreciated that embodiments of the disclosure are not limited thereto. In some other embodiments, the testing pads 104' and/or 204' are not formed.

In some embodiments, conductive features 226s are used as through-vias that form electrical connection to the substrate 10 (such as a semiconductor chip). In some embodiments, one or some of the conductive features 226s physically connect conductive pads 104 formed in the interlayer dielectric layer 102 of the substrate 10. The substrate 10 may be a semiconductor chip or a semiconductor wafer. In some embodiments, there are insulating elements (not shown) formed between the conductive features 226s and the semiconductor substrate 200 of the semiconductor die 20. In some embodiments, the insulating elements are similar to the insulating elements 222s illustrated in FIG. 1O.

Many variations and/or modifications can be made to embodiments of the disclosure. For example, some or all of the conductive features penetrating through the semiconductor substrate of the semiconductor die may be formed after the semiconductor die is bonded onto the substrate or another semiconductor die. Alternatively, some or all of the conductive features penetrating through the semiconductor substrate of the semiconductor die may be formed before the semiconductor die is bonded onto the substrate or another semiconductor die. The bonding between the substrate and the semiconductor die or the bonding between different semiconductor dies may be achieved through a fusion bonding or a hybrid bonding according to requirements.

Many variations and/or modifications can be made to embodiments of the disclosure. FIGS. 4A-4I are cross-sectional views of various stages of a process for forming a chip package, in accordance with some embodiments.

Figure 4A:
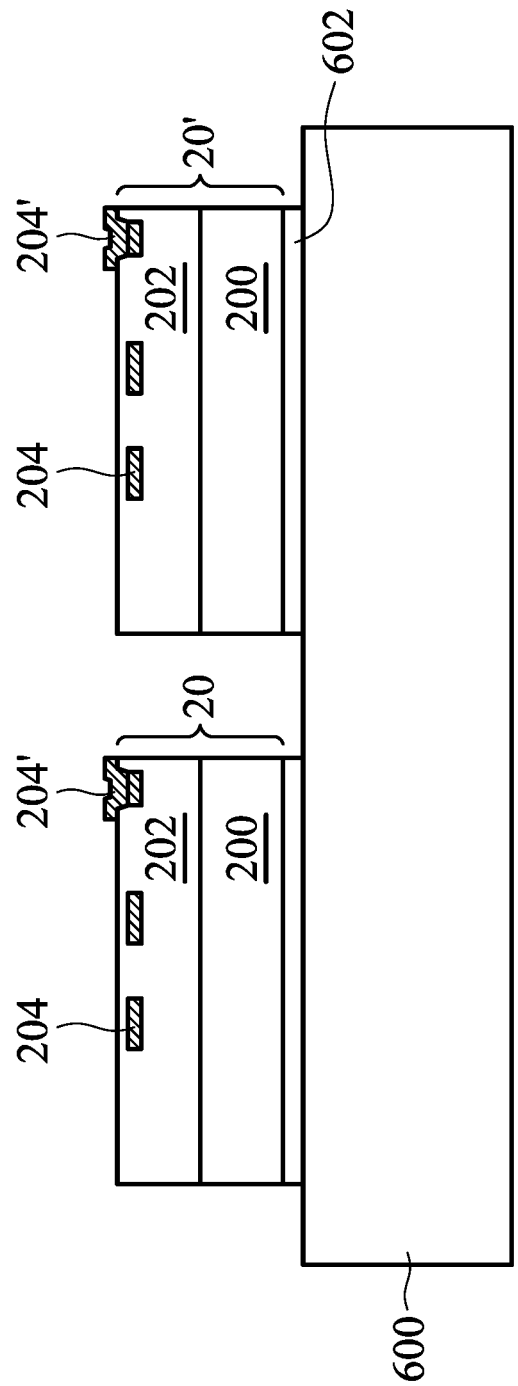
FIGS. 4A-4I are cross-sectional views of various stages of a process for forming a chip package, in accordance with some embodiments.

As shown in FIG. 4A, one or more semiconductor dies such as the semiconductor dies 20 and 20' are disposed over a carrier substrate 600, in accordance with some embodiments. The semiconductor dies 20 and 20' may be bonded onto the carrier substrate 600 through an adhesion layer 602. In some embodiments, each of the semiconductor dies 20 and 20' includes a testing pad 204'. The testing pads 204' are used for electrical testing. Multiple testing operations may be performed to ensure good quality of the semiconductor dies 20 and 20' before they are bonded onto the carrier substrate 600. In some embodiments, the carrier substrate 600 includes a semiconductor substrate (such as a silicon wafer), a dielectric substrate (such as a glass wafer), another suitable substrate, or a combination thereof.

Figure 4B:
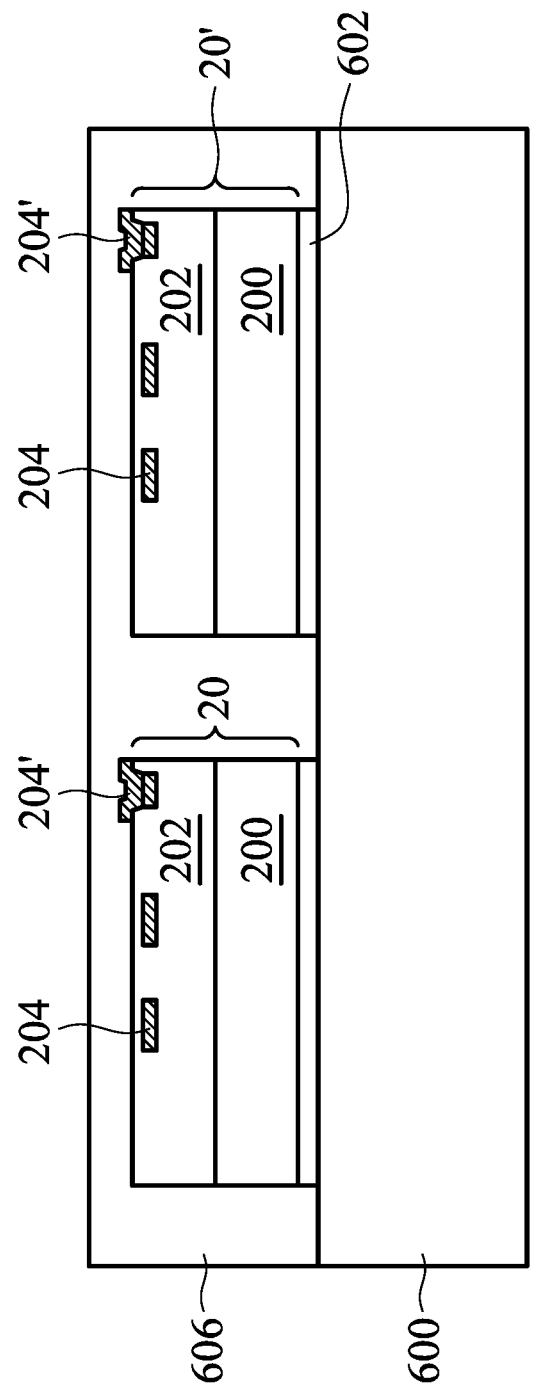

As shown in FIG. 4B, a dielectric layer 606 is deposited over the carrier substrate 600 to encapsulate the semiconductor dies 20 and 20', in accordance with some embodiments. The dielectric layer 606 surrounds and covers the semiconductor dies 20 and 20'. The dielectric layer 606 may be used to protect the semiconductor dies 20 and 20'. In some embodiments, the dielectric layer 606 is in direct contact with the semiconductor dies 20 and 20'. In some embodiments, the material and formation method of the dielectric layer 606 are similar to those of the dielectric layer 206. In some embodiments, a planarization process is used to provide the dielectric layer 606 with a substantially planar surface.

Figure 4C:
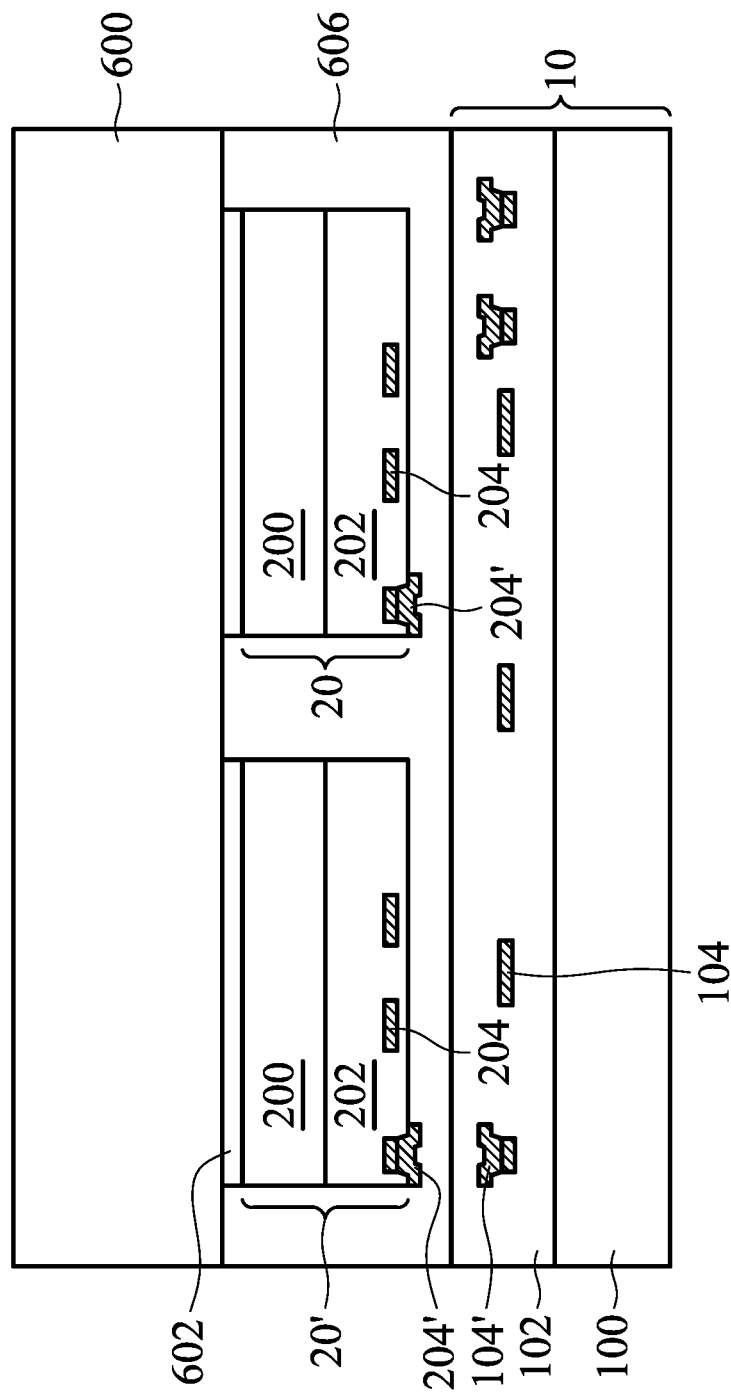

As shown in FIG. 4C, the structure as shown in FIG. 4B is bonded onto the substrate 10, in accordance with some embodiments. The structure shown in FIG. 4B may be bonded onto the substrate 10 through a wafer-to-wafer bonding. In some embodiments, the dielectric layer 606 and the interlayer dielectric layer 102 of the substrate 10 are bonded together through a fusion bonding. In some embodiments, a portion of the dielectric layer 606 is sandwiched between the semiconductor dies 20 or 20' and the substrate 10 that may be a semiconductor wafer or a semiconductor chip.

In some other embodiments, some of the conductive pads 204 or testing pads 204' of the semiconductor dies 20 and 20' are not covered by the dielectric layer 606. Some of the conductive pads 104 or testing pads 104' of the substrate 10 may be in direct contact with some of the conductive pads 204 or testing pads 204' of the semiconductor dies 20 and 20'. In these cases, the structure as shown in FIG. 4B is bonded onto the substrate 10 through a hybrid bonding. The hybrid bonding may include an oxide-to-oxide bonding and a metal-to-metal bonding.

In some embodiments, the substrate 10 is a wafer and includes the testing pads 104'. The testing pads 104' are used for electrical testing. Multiple testing operations may be performed to ensure good quality of the substrate 10 before the bonding.

Figure 4D:
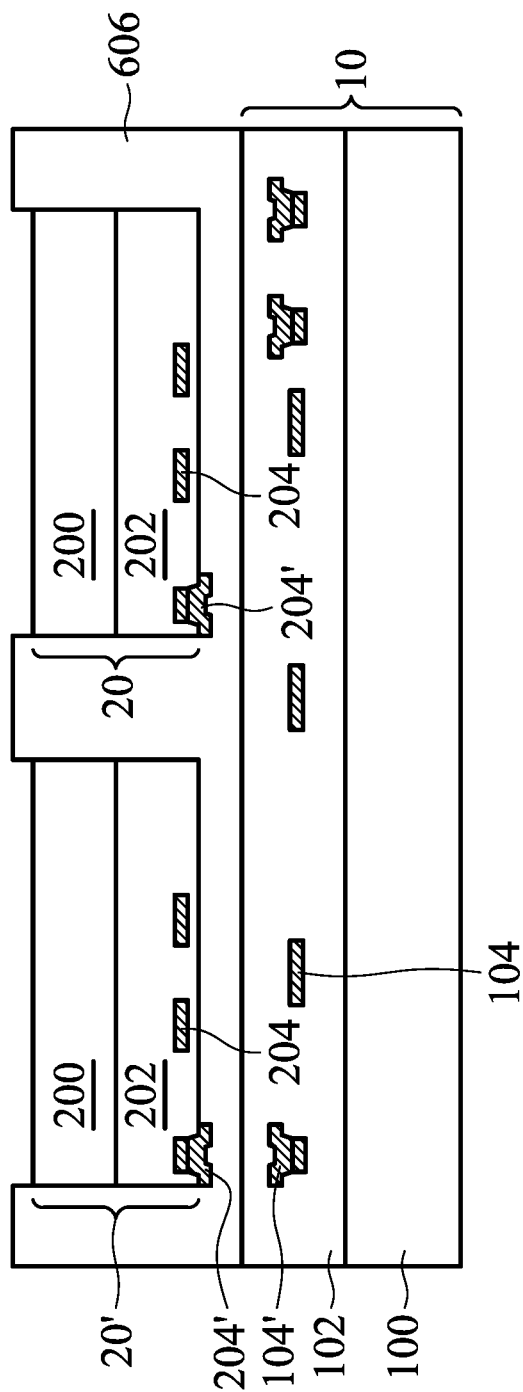

As shown in FIG. 4D, the carrier substrate 600 and the adhesion layer 602 are removed, in accordance with some embodiments. In some embodiments, the carrier substrate 600 and the adhesion layer 602 are removed simultaneously. In some other embodiments, the carrier substrate 600 is removed from the adhesion layer 602. Afterwards, the adhesion layer 602 is removed from the semiconductor dies 20 and 20'.

Figure 4E:
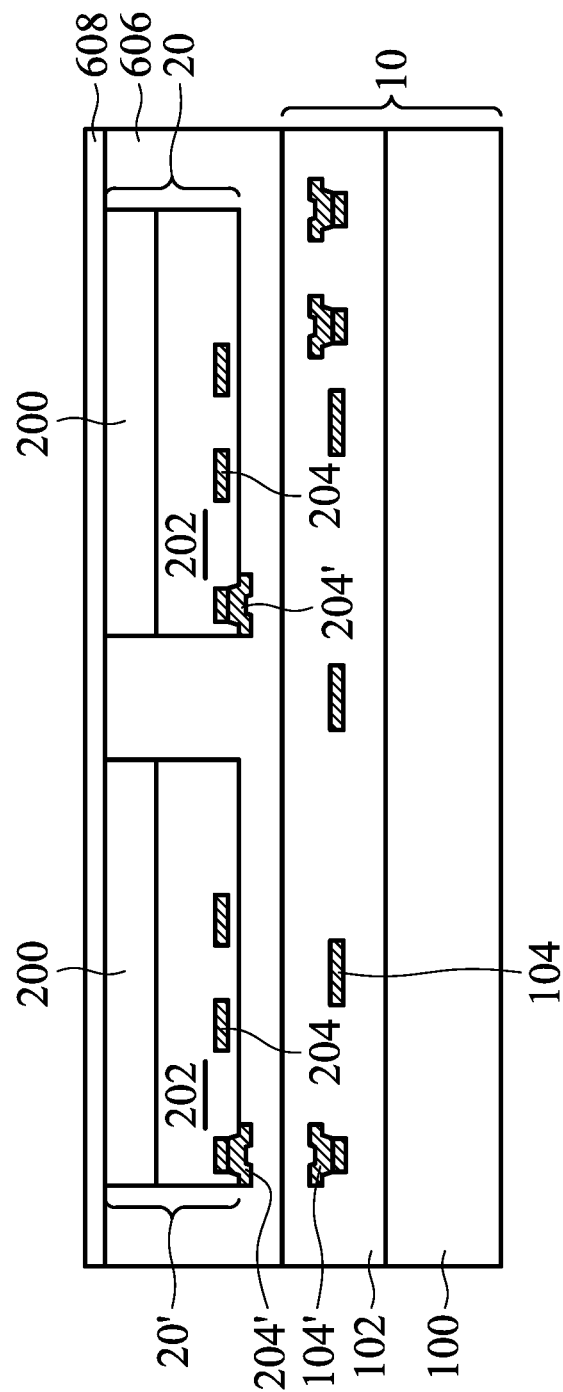

As shown in FIG. 4E, a planarization process is performed to thin down the dielectric layer 606, in accordance with some embodiments. After the planarization process, the surfaces of the dielectric layer 606 and the semiconductor dies 20 and 20' are substantially coplanar. In some embodiments, the semiconductor dies 20 and 20' are also thinned during the planarization process. The planarization process may include a CMP process, a grinding process, an etching process, another applicable process, or a combination thereof.

Afterwards, an isolation layer 608 is deposited over the dielectric layer 606 and the semiconductor dies 20 and 20', as shown in FIG. 4E in accordance with some embodiments. The isolation layer 608 may be used to electrically isolate multiple conductive features that will be formed later from each other. In some embodiments, the isolation layer 608 is made of silicon oxide, silicon oxynitride, silicon nitride, silicon carbide, another suitable material, or a combination thereof. In some embodiments, the isolation layer 608 is deposited using a CVD process, a spin-on process, a PVD process, another applicable process, or a combination thereof.

Figure 4F:
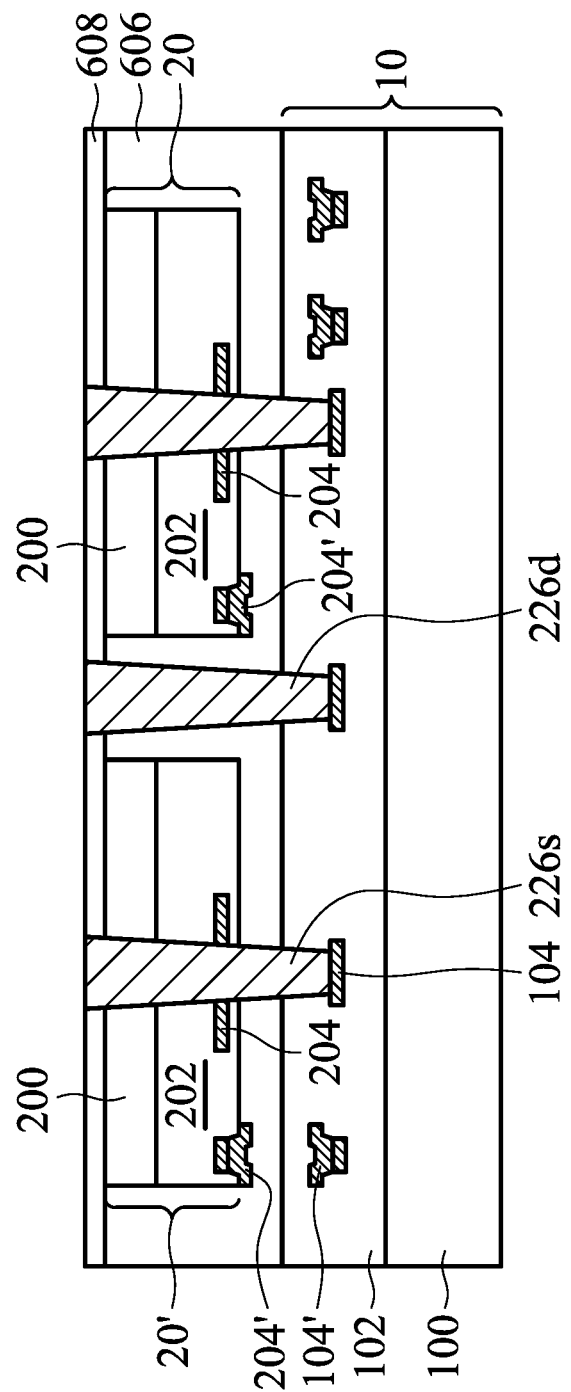

As shown in FIG. 4F, similar to the embodiments illustrated in FIG. 1M or 2, the conductive features 226s and 226d are formed, in accordance with some embodiments. Similar to the embodiments illustrated in FIG. 1M, isolation elements (not shown) may be formed between the conductive features 226s and the semiconductor substrate 200 of the semiconductor dies 20 and 20'. The isolation elements are used to provide electrical isolation between the conductive features 226s and the semiconductor substrate 200 of the semiconductor dies 20 and 20'.

Figure 4G:
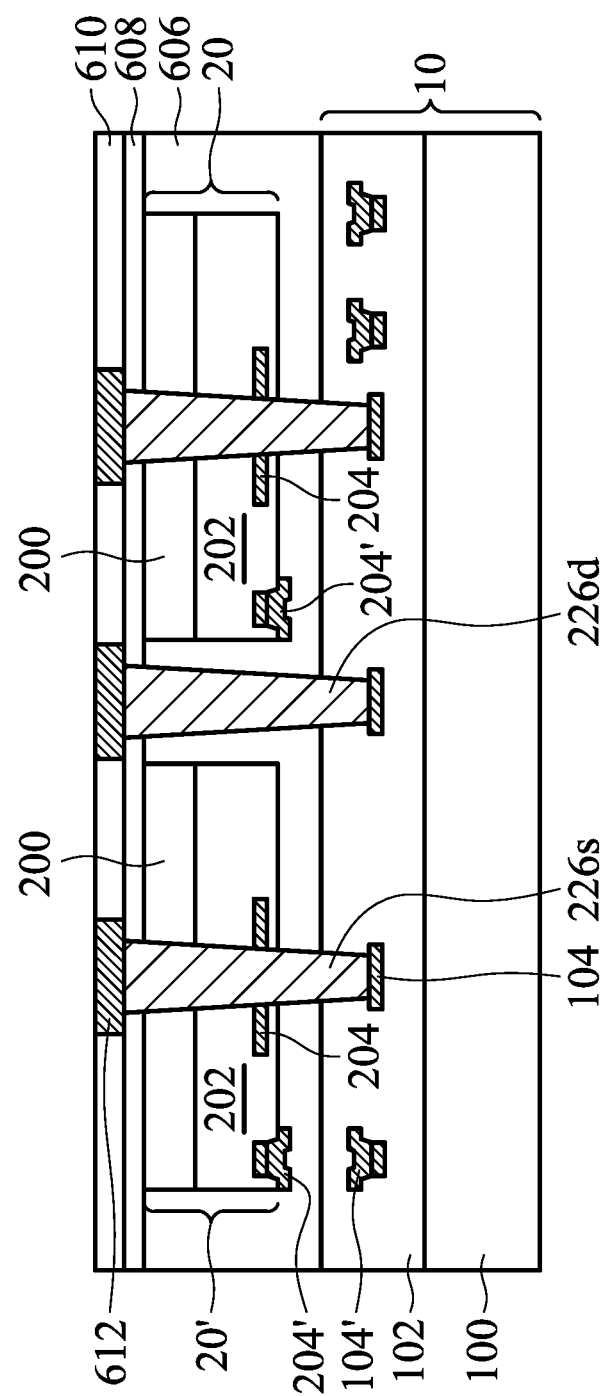

As shown in FIG. 4G, a redistribution layer 612 and a dielectric layer 610 are formed over the isolation layer 608 and the conductive features 226s and 226d, in accordance with some embodiments. The formation of the redistribution layer 612 and the dielectric layer 610 may involve multiple deposition and patterning processes.

Figure 4H:
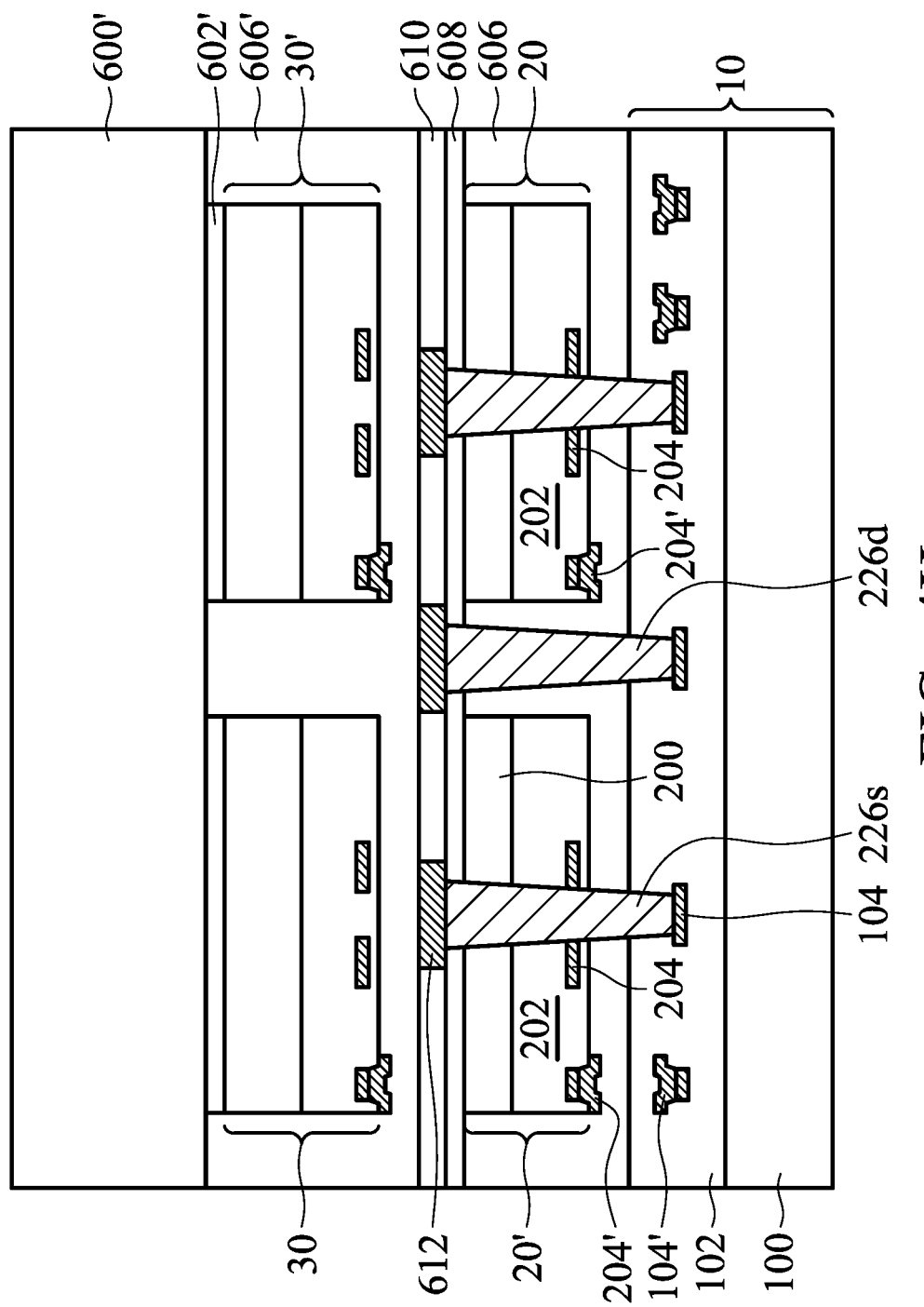

Similar to the embodiments illustrated in FIG. 4A, one or more semiconductor dies such as the semiconductor dies 30 and 30' are bonded onto a carrier substrate 600' using an adhesion layer 602', as shown in FIG. 4H in accordance with some embodiments. Afterwards, similar to the embodiments illustrated in FIG. 4B, a dielectric layer 606' is formed to encapsulate the semiconductor dies 30 and 30', in accordance with some embodiments. Then, similar to the embodiments illustrated in FIG. 4C, the dielectric layer 606' and the structure as shown in FIG. 4G are bonded through a hybrid bonding, as shown in FIG. 4H in accordance with some embodiments.

Figure 4I:
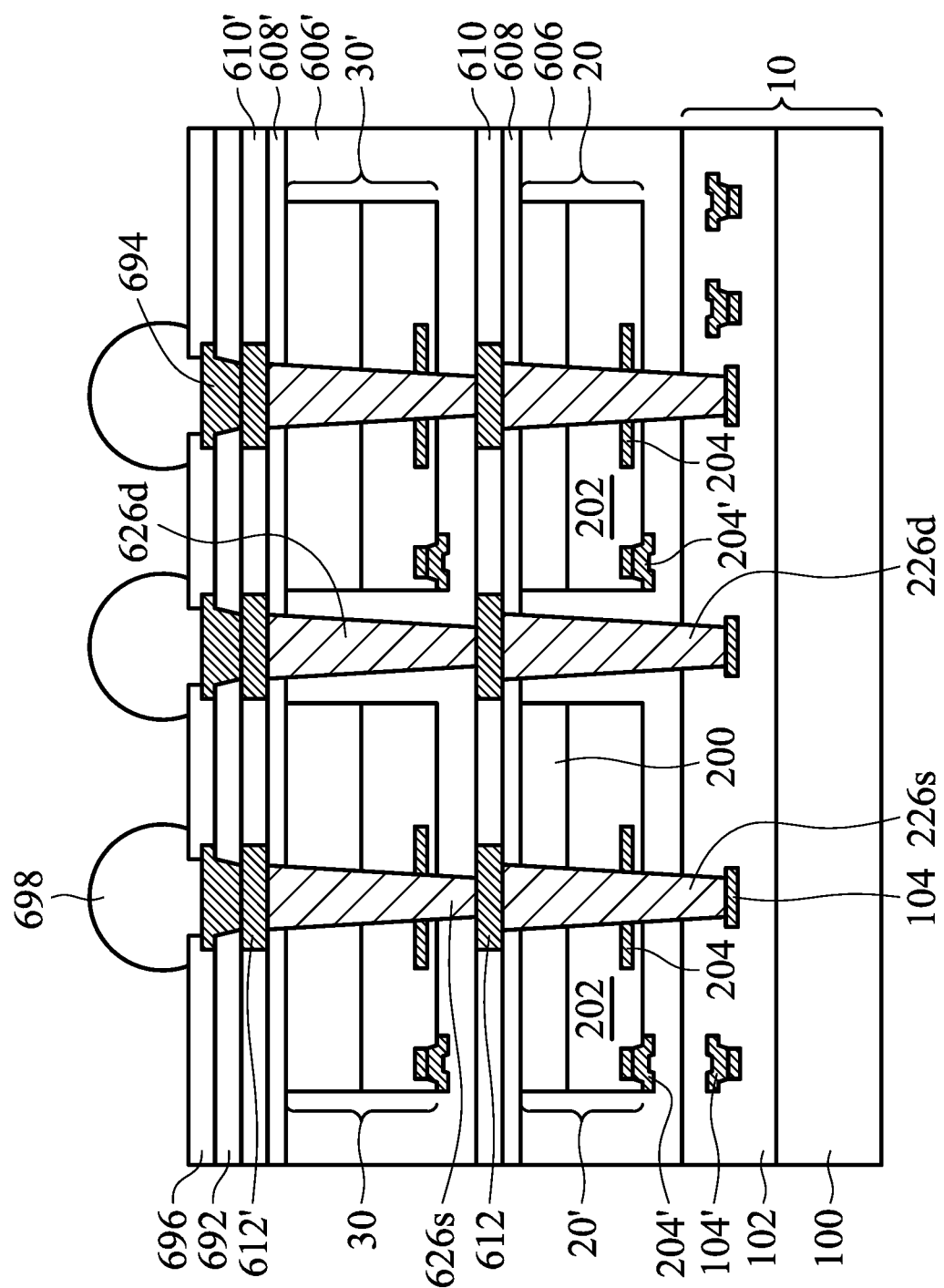

As shown in FIG. 4I, similar to the embodiments illustrated in FIGS. 4F-4G, conductive features 626s and 626d, an isolation layer 608', a redistribution layer 612', and a dielectric layer 610' are formed, in accordance with some embodiments. Afterwards, passivation layers 692 and 696, conductive pads 694, and connectors 698 are formed, as shown in FIG. 4I in accordance with some embodiments.

In some embodiments, the dielectric layers 606 and 606' are substantially free of polymer material. In some embodiments, there is no molding compound or underfill material between the dielectric layer 606 and the semiconductor dies 20 and 20' or between the dielectric layer 606' and the semiconductor dies 30 and 30'. Since the dielectric layers 606 and 606' are substantially free of polymer material or molding compound material, the coefficients of thermal expansion (CTE) of the dielectric layers 606 and 606', the semiconductor dies 20, 20', 30, and 30', and the substrate 10 are similar. Therefore, warpage due to CTE mismatch may be reduced or prevented. The quality and reliability of the chip package are improved.

Many variations and/or modifications can be made to embodiments of the disclosure. In some embodiments, dummy pads are formed to improve the flatness of the semiconductor die or the substrate. Due to the improved flatness, the bonding process for stacking multiple semiconductor dies is improved accordingly. FIGS. 5A-5F are cross-sectional views of various stages of a process for forming a chip package, in accordance with some embodiments.

As shown in FIG. 5A, a semiconductor substrate 700 is provided. In some embodiments, the semiconductor substrate 700 is a semiconductor wafer with device elements formed therein. Interconnection structure is formed over the semiconductor substrate 700. The interconnection structure includes a dielectric layer 702a and conductive pads 704a.

In some embodiments, the conductive pads 704a are portions of top metal lines of the interconnection structure and are referred to as "top metals". In some embodiments, the interconnection structure includes multiple dielectric layers, multiple conductive lines, and multiple conductive vias.

In some embodiments, the materials and formation methods of the conductive pads 704a and the dielectric layer 702a are similar to those of the conductive pads 104 and the interlayer dielectric layer 102, respectively. In some embodiments, a barrier layer 703a is formed between the conductive pads 704a and the dielectric layer 702a.

In some embodiments, a passivation layer 702b is formed over the dielectric layer 702a and the conductive pads 704a, as shown in FIG. 5A. The passivation layer 702b has an opening that exposes one of the conductive pads 704a. In some embodiments, the passivation layer 702b is made of silicon nitride, silicon oxide, silicon oxynitride, another suitable material, or a combination thereof. In some embodiments, a conductive feature such as a testing pad 704' is formed over the exposed one of the conductive pads 704a. The testing pad 704' is used for electrical testing. In some embodiments, the testing pads 704' is a aluminum pad. Multiple testing operations may be performed to ensure good quality of the device elements formed in the semiconductor substrate 700.

Afterwards, a dielectric layer 702c is deposited over the passivation layer 702b and the testing pad 704', as shown in FIG. 5B in accordance with some embodiments. In some embodiments, the material and the formation method of the dielectric layer 702c are similar to those of the interlayer dielectric layer 102. In some embodiments, a planarization process is used to provide the dielectric layer 702c with a substantially planar surface. The planarization process may include a CMP process, a grinding process, an etching process, another applicable process, or a combination thereof.

Figure 5C:
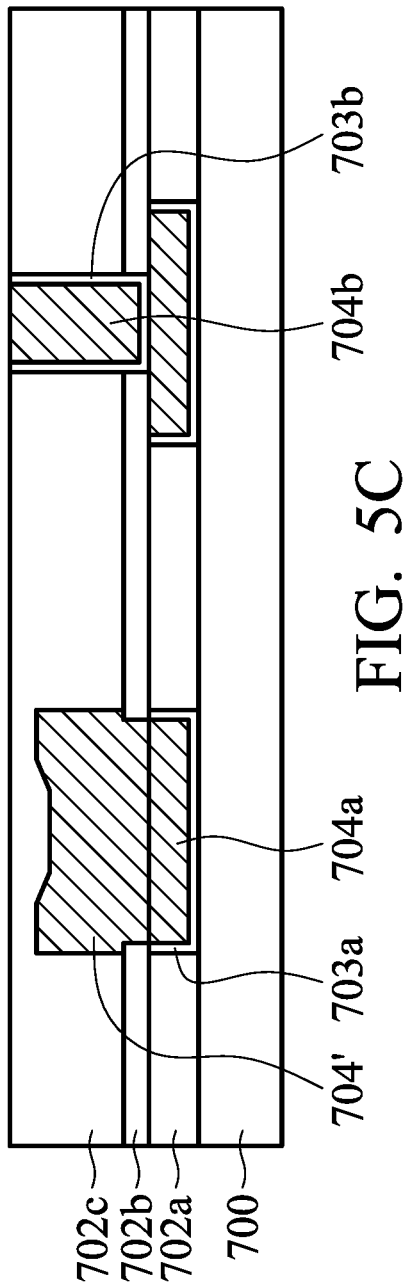

As shown in FIG. 5C, a conductive feature 704b is formed in the dielectric layer 702c, in accordance with some embodiments. The conductive feature 704b may be used as a conductive via that is electrically connected to one of the conductive pads 704a. In some embodiments, a barrier layer 703b is formed between the conductive feature 704b and the dielectric layer 702c. One or more photolithography and etching processes may be used to form an opening that penetrates through the dielectric layer 702c and the passivation layer 702b and exposes one of the conductive pads 704a. Afterwards, multiple deposition processes are used to deposit multiple layers over the bottom and sidewalls of the opening. The multiple layers may include a barrier layer, a seed layer, and a conductive layer. Then, a planarization process is performed to remove the portions of the multiple layers outside of the opening. As a result, the remaining portions of the multiple layers form the barrier layer 703b and the conductive feature 704b.

Figure 5D:
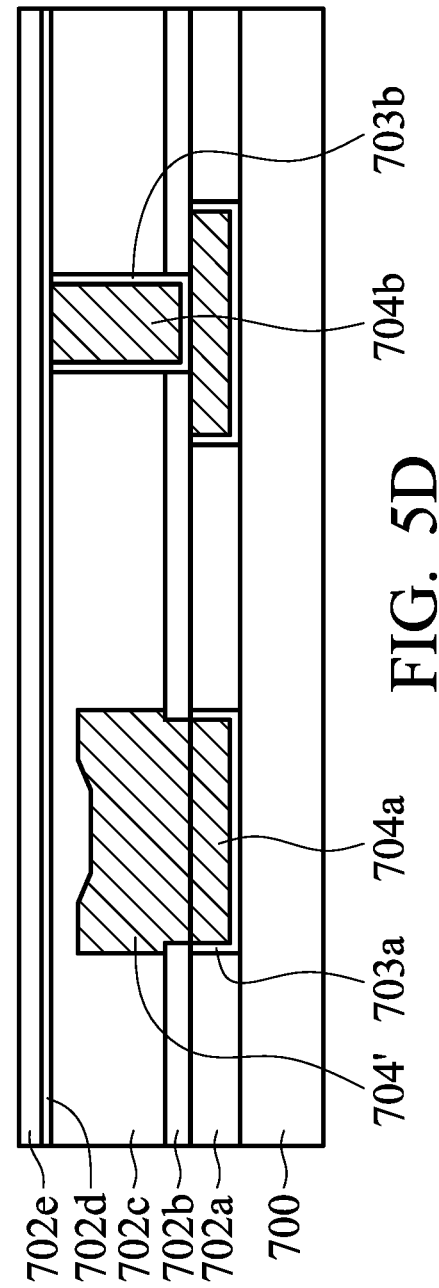

As shown in FIG. 5D, an etch stop layer 702d and a dielectric layer 702e are deposited over the dielectric layer 702c and the conductive feature 704b, in accordance with some embodiments. In some embodiments, the materials and formation methods of the etch stop layer 702d and the dielectric layer 702e are similar to those of the etch stop layer 208 and the dielectric layer 210.

Figure 5E:
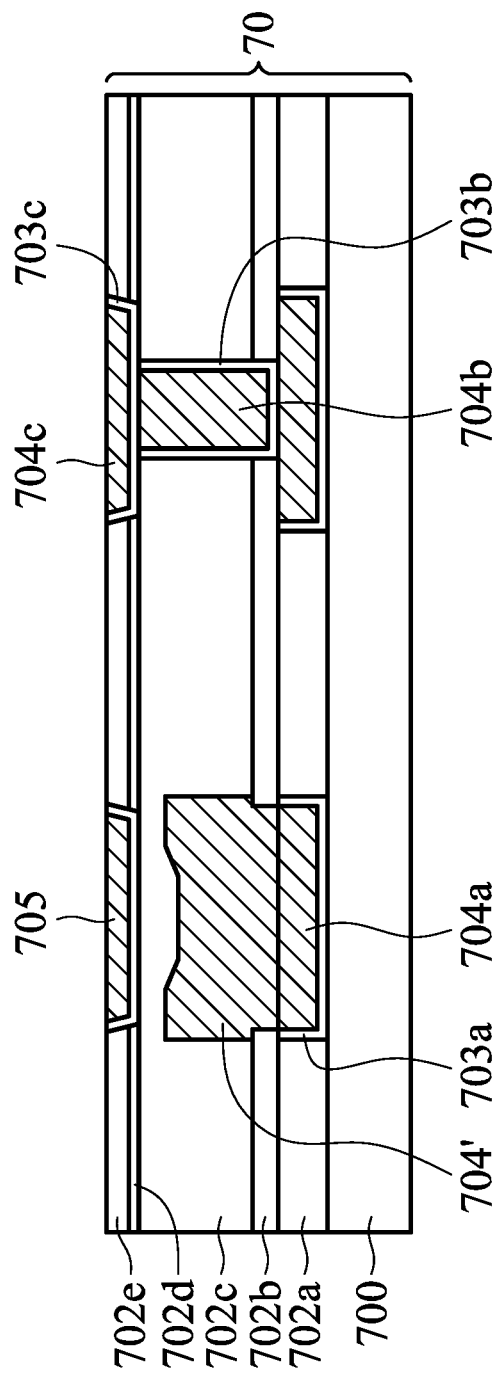

As shown in FIG. 5E, a conductive feature 704c and a dummy feature (or dummy pad) 705 are formed in the dielectric layer 702e, in accordance with some embodiments. In some embodiments, a barrier layer 703c is formed between the conductive feature 704c and the dielectric layer 702e and/or between the dummy feature 705 and the dielectric layer 702e. In some embodiments, multiple openings are formed in the dielectric layer 702e and the etch stop layer 702d using a photolithography process and an etching process. One of the openings exposes the conductive feature 704b.

Afterwards, multiple deposition processes are used to deposit multiple layers over the bottom and sidewalls of the opening. The multiple layers may include a barrier layer, a seed layer, and a conductive layer. Then, a planarization process is performed to remove the portions of the multiple layers outside of the opening. As a result, the remaining portions of the multiple layers form the barrier layer 703c, the conductive feature 704c, and the dummy feature 705. In some embodiments, the planarization process is a CMP process, a grinding process, another applicable process, or a combination thereof. As a result, a substrate 70 similar to the substrate 10 is formed, as shown in FIG. 5E. The substrate 70 may be a semiconductor wafer or a semiconductor chip.

The conductive feature 704c and the barrier layer 703c may be used as a bonding pad for bonding with another substrate, such as another semiconductor die. Similarly, the dummy feature 705 and the barrier layer 703c may be used as another bonding pad. However, embodiments of the disclosure are not limited thereto. In some other embodiments, the barrier layer 703c are not formed. In these cases, the conductive feature 704c and the dummy feature 705 are used as the bonding pads.

Figure 5F:
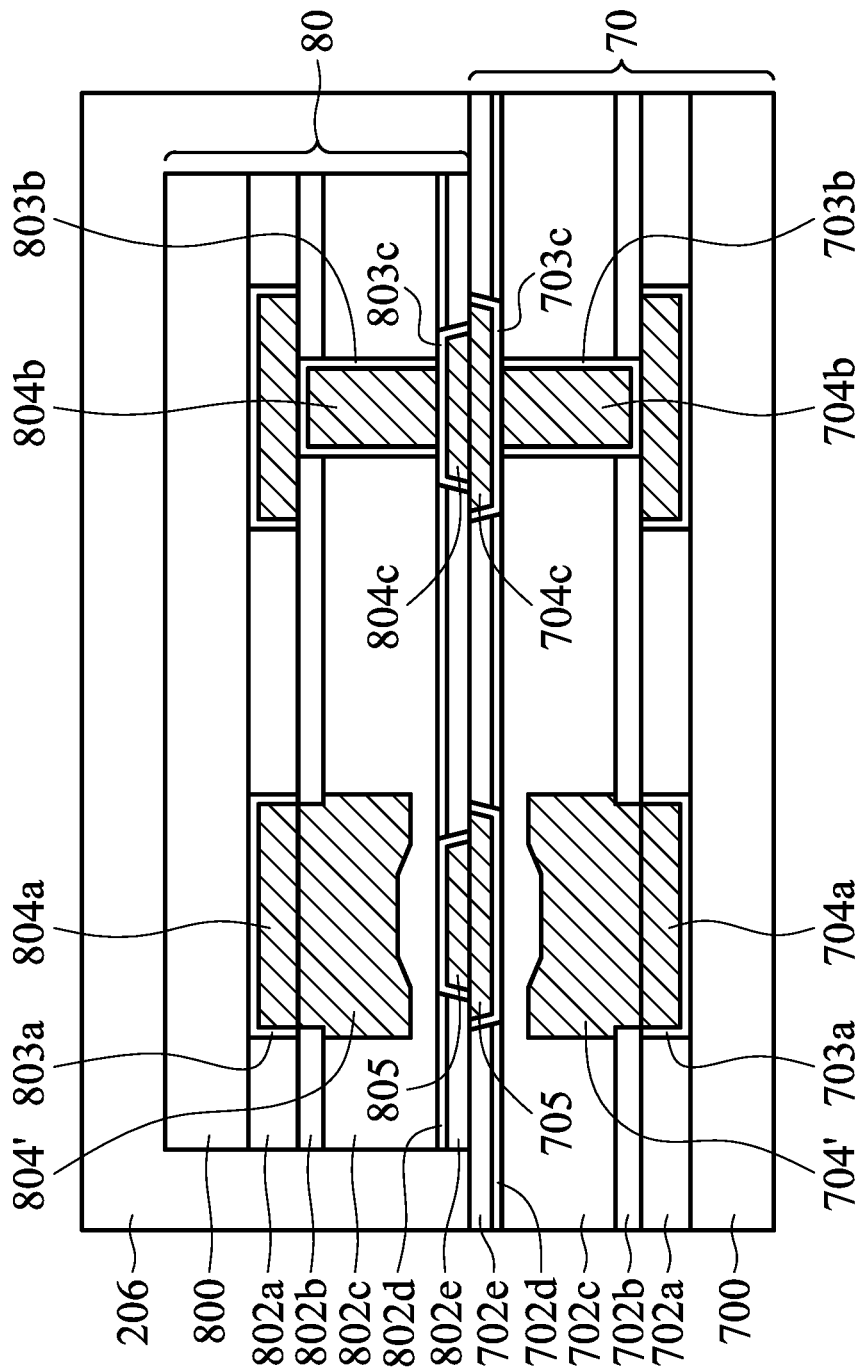

In some embodiments, the conductive feature 704b is underlying the bonding pad constructed by the conductive feature 704c and the barrier layer 703c, as shown in FIG. 5F. In some embodiments, the conductive feature 704b physically connects the bonding pad. In some embodiments, another conductive feature (such as the testing pad 704') is underlying the bonding pad constructed by the dummy feature 705 and the barrier layer 703c, as shown in FIG. 5F. In some embodiments, the conductive feature (such as the testing pad 704') is isolated from the bonding pad. For example, the conductive feature (such as the testing pad 704') is isolated from the dummy feature 705 by the dielectric layer 702c.

Due to the dummy feature 705, the surfaces of the dummy feature 705, the dielectric layer 702e, and the conductive feature 704c are substantially coplanar after the planarization process, facilitating a subsequent bonding process. In some embodiments, multiple dummy features are formed in the dielectric layer 702e. In some embodiments, these dummy features including the dummy feature 705 and other conductive features including the conductive feature 704c distribute over the semiconductor substrate 700 evenly to facilitate the planarization process.

In some cases, the dummy feature 705 is not formed. In these cases, some portions of the dielectric layer 702e may be recessed after the planarization process for forming the conductive feature 704c since there is no dummy feature to balance the polishing force. As a result, the subsequent bonding process may be negatively affected.

Afterwards, a substrate 80 is bonded onto the substrate 70, as shown in FIG. 5F in accordance with some embodiments. In some embodiments, the substrate 80 is a semiconductor wafer. In some other embodiments, the substrate 80 is a semiconductor die. In some embodiments, the substrate 80 includes a semiconductor substrate 800 and an interconnection structure.

Similar to the interconnection structure of the substrate 70, the interconnection structure of the substrate 80 may include dielectric layers 802a, 802c, and 802e, a passivation layer 802b, an etch stop layer 802d, conductive pads 804a, conductive features 804b and 804c, barrier layers 803a, 803b, and 803c, and a dummy feature 805. The conductive feature 804c and the barrier layer 803c may be used as a bonding pad. The dummy feature 805 and the barrier layer 803c may be used as another bonding pad. In some embodiments, the substrate 80 is bonded onto the substrate 70 through the bonding pads respectively formed on the substrates 70 and 80. Similarly, due to the dummy feature 805, the surfaces of the dummy feature 805, the dielectric layer 802e, and the conductive feature 804c are substantially coplanar. Therefore, the bonding process for bonding the substrates 70 and 80 together is improved.

As shown in FIG. 5F, similar to the embodiments illustrated in FIG. 1D, the dielectric layer 206 is deposited to encapsulate the substrate 80 to form a chip package, in accordance with some embodiments. In some embodiments, processes similar to those shown in FIGS. 1E-1O are performed to form a chip package including more semiconductor dies. In some embodiments, the dummy feature 705 is not electrically connected to any conductive feature that penetrates through the dielectric layer 206.

In the embodiments illustrated in FIGS. 5A-5F, bonding pads are used for bonding the substrates 70 and 80. In some embodiments, bonding pads are used in the embodiments shown in FIG. 1A-1O or 3 to assist in the bonding process. In some embodiments, through-vias similar to the conductive features 226s, 226d are formed in the substrate 80 to form electrical connection to the substrate 70. One of the through-vias may penetrate through the dielectric layer 206 and physically connects one of the conductive pads 704a of the substrate 70 (such as a semiconductor chip). One of the through-vias may penetrates through the semiconductor substrate 800 of the substrate 80 (such as a semiconductor die) and physically connects one of the conductive pads 704a of the substrate 70 (such as a semiconductor chip).

Many variations and/or modifications can be made to embodiments of the disclosure. In some other embodiments, the dielectric layer 206 is made of a molding compound.

Many variations and/or modifications can be made to embodiments of the disclosure. For example, the formation of the dummy feature is not limited to those illustrate in FIGS. 5A-5F. FIGS. 6A-6E are cross-sectional views of various stages of a process for forming a chip package, in accordance with some embodiments.

As shown in FIG. 6A, a seed layer 903 is deposited over the structure as shown in FIG. 5C, in accordance with some embodiments. In some embodiments, a barrier layer (not shown) is deposited over the structure as shown in FIG. 5C before the deposition of the seed layer 903.

As shown in FIG. 6B, a mask layer 904 is formed over the seed layer 903, in accordance with some embodiments. The mask layer 904 has openings that expose the seed layer 903. The openings define the positions where the conductive feature 704c and the dummy feature 705 are formed. In some embodiments, the mask layer 904 is made of a photoresist material. A photolithography process may be used to form the openings. Afterwards, an electroplating process or another applicable process is used to deposit conductive material over the portions of the seed layer 903 exposed by the openings. As a result, the conductive feature 704c and the dummy feature 705 are formed. In some embodiments, the conductive material does not fill the openings completely.

As shown in FIG. 6C, the mask layer 904 is removed, and the seed layer 903 is partially removed, in accordance with some embodiments. In some embodiments, the conductive feature 704c and the dummy feature 705 are used as a mask, and an etching process is performed to partially remove the seed layer 903. In some embodiments, portions of the seed layer 903 below the conductive feature 704c and the dummy feature 705 are removed, as shown in FIG. 6C.

As shown in FIG. 6D, a dielectric layer 702e' is deposited over the dielectric layer 702c to surround the conductive feature 704c and the dummy feature 705, in accordance with some embodiments. In some embodiments, a planarization process is performed such that surfaces of the dielectric layer 702e', the conductive feature 704c, and the dummy feature 705 are substantially coplanar. Due to the dummy feature 705, the surfaces of the dummy feature 705, the dielectric layer 702e', and the conductive feature 704c are substantially coplanar after the planarization process, facilitating a subsequent bonding process. In some embodiments, multiple dummy features are formed in the dielectric layer 702e'. In some embodiments, these dummy features including the dummy feature 705 and other conductive features including the conductive feature 704c distribute over the semiconductor substrate 700 evenly to facilitate the planarization process.

Figure 6E:
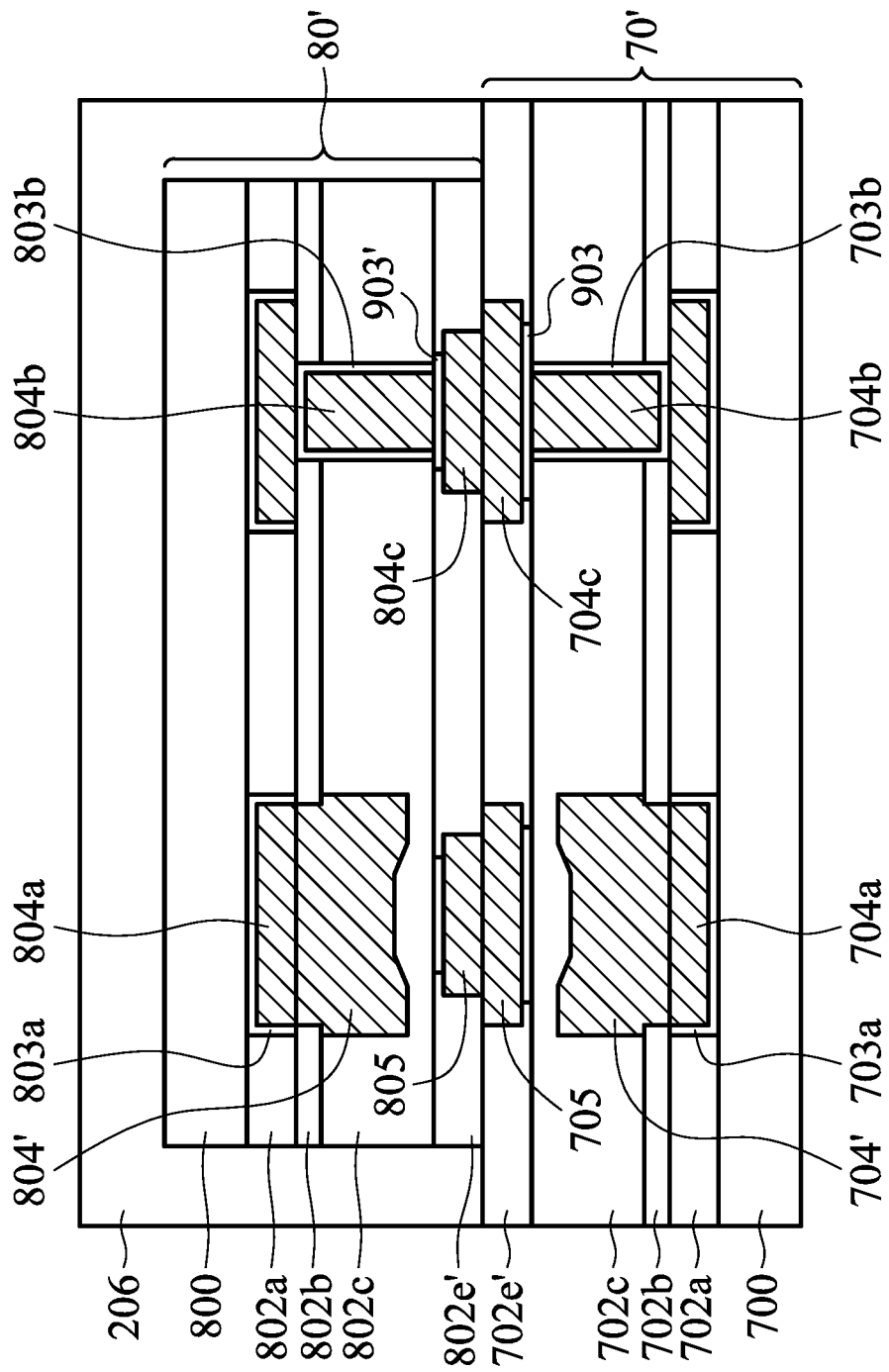

As shown in FIG. 6E, similar to the embodiments illustrated in FIG. 5F, a substrate 80' is bonded onto the substrate 70', as shown in FIG. 6E in accordance with some embodiments. In some embodiments, the substrate 80' is a semiconductor wafer. In some other embodiments, the substrate 80' is a semiconductor die. In some embodiments, similar to the substrate 80, the substrate 80' includes the semiconductor substrate 800 and an interconnection structure. Similar to the interconnection structure of the substrate 70' or the substrate 80, the interconnection structure of the substrate 80' may include the dielectric layers 802a, 802c, and 802e', the passivation layer 802b, the etch stop layer 802d, the conductive pads 804a, the conductive features 804b and 804c, the barrier layers 803a, 803b, and 803c, a seed layer 903', and the dummy feature 805. Similarly, due to the dummy feature 805, the surfaces of the dummy feature 805, the dielectric layer 802e', and the conductive feature 804c are substantially coplanar. Therefore, the bonding process for bonding the substrates 70' and 80' together is improved.

As shown in FIG. 6E, similar to the embodiments illustrated in FIG. 1D, the dielectric layer 206 is deposited to encapsulate the substrate 80' to form a chip package, in accordance with some embodiments. In some embodiments, processes similar to those shown in FIGS. 1E-1O are performed to form a chip package including more semiconductor dies.

The dummy features (or dummy pads) mentioned above may be used in many embodiments of the disclosure. In some embodiments, the dummy features are formed in the embodiments illustrated in FIG. 1D, 1M, 1N, 1O, 2B, 3, 4F, or 4I.

Many variations and/or modifications can be made to embodiments of the disclosure. As mentioned above, the chip package in accordance with embodiments of the disclosure may further be integrated into another package structure. In some embodiments, the chip package illustrated in the embodiments shown in FIG. 1D, 1M, 1N, 1O, 2B, 3, 4F, 4I, 5F or 6E is further packaged in an integrated fan-out (InFO) package structure.

Figure 7:
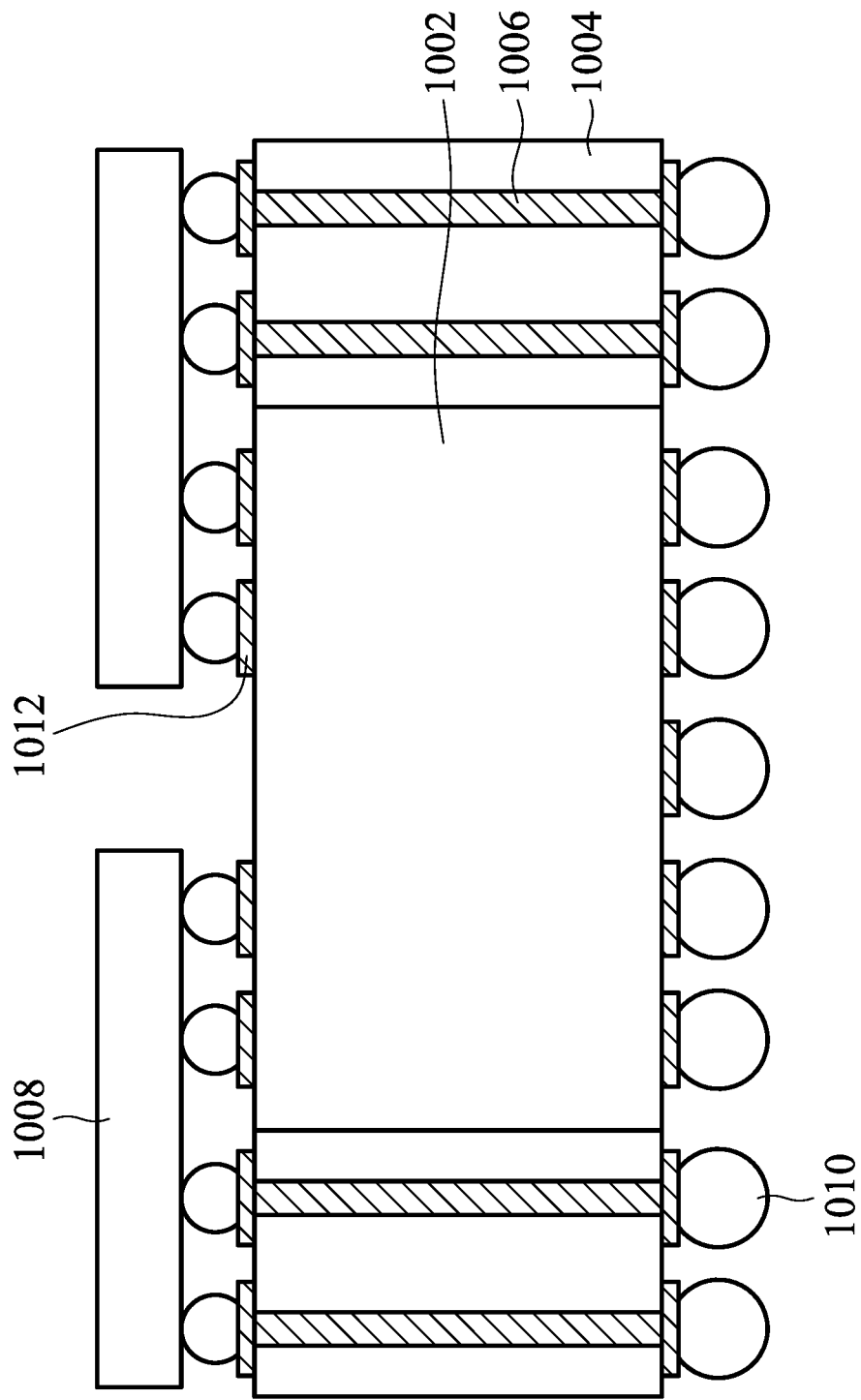
FIG. 7 is a cross-sectional view of a package structure, in accordance with some embodiments.

FIG. 7 is a cross-sectional view of a package structure, in accordance with some embodiments. In some embodiments, the package structure includes a molding compound layer 1004 that partially or completely encapsulating an element 1002. In some embodiments, the element 1002 includes a semiconductor die. In some embodiments, the element 1002 is a chip package. The chip package includes the embodiments illustrated in FIG. 1D, 1M, 1N, 1O, 2B, 3, 4F, 4I, 5F or 6E.

In some embodiments, the package structure includes one or more through package vias 1006 that penetrate through the molding compound layer 1004. In some embodiments, one or more semiconductor dies 1008 are disposed over redistribution layers 1012 formed on the molding compound layer 1004 and the element 1002, as shown in FIG. 7. In some embodiments, connectors 1010 are formed over other sides of the molding compound layer 1004 and the element 1002. In some embodiments, the through package vias 1006 form electrical connections between the semiconductor dies 1008 and the connectors 1010. In some embodiments, some of the redistribution layers 1012 form electrical connections between the semiconductor dies 1008 and the semiconductor dies in the element 1002.

Many variations and/or modifications can be made to embodiments of the disclosure. In some embodiments, the fan-out package structure mentioned above or the chip package illustrated in the embodiments shown in FIG. 1D, 1M, 1N, 1O, 2B, 3, 4F, 4I, 5F or 6E is further packaged in a chip-on-wafer-on-substrate (CoWoS) package structure.

Embodiments of the disclosure stack one or more semiconductor dies over a substrate. Conductive features penetrating through the semiconductor die or the dielectric layer are also formed to provide electrical connection in a vertical direction. The size of the chip package is further reduced. The semiconductor dies are encapsulated using a dielectric layer substantially made of semiconductor oxide material. Therefore, the coefficients of thermal expansion of the dielectric layer, the semiconductor dies, and the substrate are similar. Warpage due to CTE mismatch may be reduced or prevented. The quality and reliability of the chip package are improved.

In accordance with some embodiments, a chip package is provided. The chip package includes a semiconductor chip and a semiconductor die over the semiconductor chip. The chip package also includes a dielectric layer over the semiconductor chip and encapsulating the semiconductor die, and the dielectric layer is substantially made of a semiconductor oxide material. The chip package further includes a conductive feature penetrating through a semiconductor substrate of the semiconductor die and physically connecting a conductive pad of the semiconductor chip.

In accordance with some embodiments, a chip package is provided. The chip package includes a semiconductor chip and a semiconductor die over the semiconductor chip. The chip package also includes a dielectric layer encapsulating the semiconductor die, and dielectric layer is substantially free of polymer material. The chip package further includes a conductive feature penetrate through a semiconductor substrate of the semiconductor chip and a connector over the semiconductor substrate and electrically connected to the conductive feature. The semiconductor chip is between the semiconductor die and the connector.

In accordance with some embodiments, a chip package is provided. The chip package includes a semiconductor chip and a semiconductor die bonded to the semiconductor chip. The semiconductor die is in direct contact with the semiconductor chip. The chip package also includes a conductive feature penetrating through a semiconductor substrate of the semiconductor die and physically connecting a conductive pad of the semiconductor chip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a semiconductor substrate;
   a first dielectric layer over the semiconductor substrate, the first dielectric layer comprising a first conductive pad and a second conductive pad;
   a semiconductor die on a first region of the semiconductor substrate, the semiconductor die comprising a third conductive pad over the first dielectric layer;
   a second dielectric layer over the first dielectric layer;
   a first conductive feature penetrating through the second dielectric layer to physically contact the third conductive pad;
   an insulating element disposed between sidewalls of the first conductive feature and the second dielectric layer, wherein a width of the insulating element increases in a direction from the top of the insulating element towards the semiconductor substrate;
   a second conductive feature on a second region of the semiconductor substrate, wherein the second conductive feature extends through the second dielectric layer and extends partially through the first dielectric layer to contact the second conductive pad, and wherein the second region of the semiconductor substrate is different than the first region of the semiconductor substrate; and
   a third conductive feature penetrating through the second dielectric layer and the semiconductor die to contact the first conductive pad, wherein a bottommost surface of the third conductive feature has a smaller width than a width of a bottommost surface of the first conductive feature and a width of a bottommost surface of the second conductive feature.

2. The semiconductor device of claim 1, wherein the first dielectric layer on the second region of the semiconductor substrate comprises a first portion and a second portion, wherein the first portion is less thick than the second portion.

3. The semiconductor device of claim 2, wherein a thickness of a third portion of the first dielectric layer on the first region of the semiconductor substrate is larger than a thickness of the first portion.

4. The semiconductor device of claim 1, wherein a material of the first conductive feature and a material of the second conductive feature are the same.

5. The semiconductor device of claim 1, wherein the first dielectric layer and the second dielectric layer comprise different materials.

6. The semiconductor device of claim 1, wherein the second dielectric layer comprises multiple sub-layers.

7. The semiconductor device of claim 1, wherein a material of the insulating element is different from a material of the second dielectric layer.

8. A semiconductor device comprising:
   a first dielectric layer over a semiconductor substrate;
   a die on a first region of the semiconductor substrate, wherein the die comprises a contact pad over the first dielectric layer;

a second dielectric layer over the first dielectric layer;
a third dielectric layer over the second dielectric layer and the die, the third dielectric layer extending laterally past edges of the die, wherein the second dielectric layer is disposed between a back surface of the die and the third dielectric layer;
a first metallic feature penetrating completely through the second dielectric layer and the third dielectric layer, the first metallic feature being electrically connected to the contact pad of the die, wherein a top portion of the first metallic feature that extends completely through the third dielectric layer has a uniform first width, and a bottom portion of the first metallic feature that extends completely through the second dielectric layer has a uniform second width, wherein the first width is larger than the second width; and
a second metallic feature extending completely through the second dielectric layer and the third dielectric layer in a second region of the semiconductor substrate, wherein the second region is different than the first region of the semiconductor substrate, wherein a bottom surface of the second metallic feature is lower than a bottom surface of the first metallic feature.

9. The semiconductor device of claim 8, wherein the second metallic feature extends through to the first dielectric layer.

10. The semiconductor device of claim 8, wherein a sidewall of the first metallic feature and a sidewall of the second metallic feature physically contact a fourth dielectric layer, wherein the fourth dielectric layer is disposed between the second dielectric layer and the third dielectric layer, wherein a material of the fourth dielectric layer is different from materials of the second dielectric layer and the third dielectric layer.

11. The semiconductor device of claim 8, wherein a first thickness of the first dielectric layer in the first region is larger than a second thickness of the first dielectric layer in the second region.

12. The semiconductor device of claim 8, wherein the first metallic feature comprises:
a via portion; and
a pad portion that extends from a top surface of the via portion.

13. The semiconductor device of claim 12, wherein a width of the contact pad of the die is larger than a width of the via portion of the first metallic feature.

14. The semiconductor device of claim 8, wherein a material of the first dielectric layer is different from a material of the second dielectric layer.

15. A semiconductor device comprising:
a semiconductor substrate;
a first insulating layer over the semiconductor substrate;
a device element on a first region of the semiconductor substrate, the device element comprising a conductive pad over the first insulating layer;
a second insulating layer over the first insulating layer and around the device element;
a first conductive element extending through the second insulating layer in the first region to physically contact the conductive pad, wherein a width of the conductive pad is larger than a width of a bottom surface of the first conductive element;
a second conductive element extending through the second insulating layer and partially through the first insulating layer in a second region of the semiconductor substrate, wherein a first material of the first insulating layer and a second material of the second insulating layer are different; and
an insulating spacer on a sidewall of the first conductive element, wherein the insulating spacer physically separates the first conductive element from the second insulating layer, and wherein a width of the insulating spacer increases in a direction from the top of the insulating spacer towards the semiconductor substrate.

16. The semiconductor device of claim 15, wherein the bottom surface of the first conductive element is higher than a bottom surface of the second conductive element.

17. The semiconductor device of claim 15, wherein the semiconductor substrate comprises silicon.

18. The semiconductor device of claim 15, wherein the device element comprises a logic device or a memory device.

19. The semiconductor device of claim 15, wherein the second insulating layer comprises two or more sub-layers.

20. The semiconductor device of claim 19, wherein the second insulating layer comprises a sub-layer that includes an oxide material.

* * * * *